(12) United States Patent
Aoyagi

(10) Patent No.: US 8,530,116 B2
(45) Date of Patent: Sep. 10, 2013

(54) COLORED CURABLE COMPOSITION FOR COLOR FILTER, COLOR FILTER AND METHOD FOR PRODUCING THE SAME, AND SOLID STATE IMAGING DEVICE

(75) Inventor: Kaoru Aoyagi, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 639 days.

(21) Appl. No.: 12/726,348

(22) Filed: Mar. 18, 2010

(65) Prior Publication Data

US 2010/0248095 A1 Sep. 30, 2010

(30) Foreign Application Priority Data

Mar. 31, 2009 (JP) .................................. 2009-087727

(51) Int. Cl.
*G03F 7/00* (2006.01)
*G03F 7/004* (2006.01)
*G03F 7/027* (2006.01)
*G03F 7/028* (2006.01)

(52) U.S. Cl.
USPC .......... 430/7; 430/270.1; 430/281.1; 430/913

(58) Field of Classification Search
None
See application file for complete search history.

(56) References Cited

U.S. PATENT DOCUMENTS

| 2002/0025481 | A1 | 2/2002 | Koike et al. | |
| 2006/0183815 | A1 | 8/2006 | Alzer et al. | |
| 2011/0003241 | A1* | 1/2011 | Kaneko et al. | 430/7 |

FOREIGN PATENT DOCUMENTS

| EP | 0768321 A | 4/1997 |
| EP | 0930540 A | 7/1999 |
| EP | 1174765 A1 | 1/2002 |
| EP | 1935652 | 6/2008 |
| JP | 63-30057 B | 6/1988 |
| JP | 5-127382 A | 5/1993 |
| JP | 7-207012 A | 8/1995 |
| JP | 9-157374 A | 6/1997 |
| JP | 9-157592 A | 6/1997 |
| JP | 9-169821 A | 6/1997 |
| JP | 9-176511 A | 7/1997 |
| JP | 2001-059906 A | 3/2001 |
| JP | 2001-272524 A | 10/2001 |
| JP | 2002-189296 | 7/2002 |
| JP | 2002-226587 A | 8/2002 |
| JP | 2004-37986 A | 2/2004 |
| JP | 2005-316012 A | 11/2005 |
| JP | 2006-30541 A | 2/2006 |
| JP | 2006-206902 A | 8/2006 |
| JP | 2006-317924 | 11/2006 |
| JP | 2007-65155 | 3/2007 |
| WO | 2009/025297 A1 | 2/2009 |
| WO | WO 2009/096452 | * 8/2009 |

OTHER PUBLICATIONS

Machine translation of JP 2001-272524 (no date).*
Partial English language translation of the following: Office action dated Mar. 19, 2013 from the Japanese Patent Office in a Japanese patent application corresponding to the instant patent application. This office action translation is submitted now in order to supplement the understanding of patent document JP 2006-317924, JP2007-65155 and JP2002-189296 which are in the office action and are being disclosed in the instant Information Disclosure Statement.
Corresponding EPO Official communication dated Jan. 30, 2013.

* cited by examiner

*Primary Examiner* — Amanda C. Walke
(74) *Attorney, Agent, or Firm* — SOLARIS Intellectual Property Group, PLLC

(57) ABSTRACT

A colored curable composition for a color filter includes: (A) a pigment in an amount of from 35 to 70 mass % with respect to the total solid content of the colored curable composition, (B) an amino resin, (C) an alkali-soluble resin, (D) a polymerizable monomer, and (E) a photopolymerization initiator, in which the proportion of (B) the amino resin to (C) the alkali-soluble resin (B/C; mass ratio) is in the range of from 1 to 10.

15 Claims, No Drawings

COLORED CURABLE COMPOSITION FOR COLOR FILTER, COLOR FILTER AND METHOD FOR PRODUCING THE SAME, AND SOLID STATE IMAGING DEVICE

CROSS-REFERENCE TO RELATED APPLICATIONS

This application claims priority under 35 USC 119 from Japanese Patent Application No. 2009-087727 filed on Mar. 31, 2009, the disclosure of which is incorporated herein by reference.

BACKGROUND OF THE INVENTION

1. Field of the Invention

The present invention relates to a colored curable composition for a color filter, a color filter and a method for producing the same, and a solid state imaging device.

2. Description of the Related Art

Liquid crystal display devices (such as LCDs) and solid state imaging devices (such as CCDs and CMOSs) have color filters having colored areas of, for example, red (R), green (G), and blue (B). The color filter is generally produced by forming a colored pattern by applying a colored curable composition onto a support.

In order to form the colored pattern, a method of patterning a colored photosensitive composition utilizing a photolithography method has been widely employed, the colored photosensitive composition containing a pigment that is dispersed in any of various photosensitive compositions by, for example, a pigment dispersion method. In a specific example of the production of a color filter, a colored photosensitive composition is applied onto a substrate by, for example, a spin coater or a roll coater to form a coating film, and pattern-exposing and developing the coating film to form a colored pattern, and this process is repeated for a number of times corresponding to the number of the desired hues. According to the method, since the photolithography method is used, the positional accuracy is high. Therefore, the method is suitable for producing color filters having a big screen and a high resolution.

In recent years, the thickness of the colored pattern of the color filter have been reduced and the resolution thereof have been increased, which is expected to improve the color density or the color tone. Moreover, the size of the colored pattern has also been decreased. These trends are particularly remarkable in color filters for solid state imaging devices. In the color filters for solid state imaging devices, the reduction in the thickness (e.g., to a thickness of 1 μm or less) of the colored pattern has been in demand particularly from the viewpoint of improving the image quality through higher light gathering properties and improved light color separation properties. In order to reduce the thickness thereof, it is necessary to increase the concentration of a coloring material in consideration of color density. However, an increase in the concentration of a coloring material remarkably reduces the sensitivity, as a result of which the pattern is likely to detach at a low exposure range.

These filter properties of the color filters are influenced by the exposure sensitivity during exposure treatment, pattern shape, development residue, adhesiveness to a substrate, and the like in many cases, and the exposure properties of the composition in an exposure stage before development treatment are important factors. As one of the methods for improving such exposure properties, various studies on initiators have been conducted, and the selection of initiators or a method for increasing the amount thereof is known.

For example, Japanese Patent Application Laid-Open (JP-A) No. 2005-316012 discloses, as a technique relevant to the above, a radiation-sensitive resin composition for forming a colored layer using an α-amino alkyl phenone-based photopolymerization initiator with a polyfunctional monomer in consideration of development properties, pattern shape, and the like when forming a colored layer of a color filter.

SUMMARY OF THE INVENTION

In order to increase a pigment concentration for reducing the thickness of a color filter, it is necessary to increase the proportion of a pigment dispersion liquid for use in the preparation of a curable composition. However, the dispersion stability is likely to decrease due to an increase in the pigment content. When the proportion of resin components that contribute to dispersibility is increased so as to increase the stability, the development properties decrease. When the pigment concentration is increased, relative amount of curable components (components that contribute to photolithography capability) in a curable composition decreases, resulting in difficulty of maintaining the photolithography capability.

Therefore, when the pigment proportion is increased, the selection of initiators or the method of increasing the amount thereof alone may be insufficient to secure exposure properties, i.e., photolithography capability, while maintaining the dispersibility. The α-aminoalkylphenone-based photopolymerization initiator is a polymerization initiator whose activity is relatively weak. Thus, even when a large amount of the α-aminoalkylphenone-based photopolymerization initiator is contained, a desired pattern is not obtained.

The invention has been made in view of the above circumstances, and aims at providing a colored curable composition for forming a color filter excellent in the dispersibility of pigment and pattern formation properties (photolithography capability), a color filter having a high resolution and a favorable pattern shape (particularly rectangular properties of a pattern in the case of solid state imaging devices) and a method for producing the same, and a solid state imaging device excellent in color reproduction properties.

According to an aspect of the invention, there is provided a colored curable composition for a color filter, including:

(A) a pigment in a amount of from 35 to 70 mass % with respect to the total solid content of the colored curable composition, (B) an amino resin, (C) an alkali-soluble resin, (D) a polymerizable monomer, and (E) a photopolymerization initiator, the ratio of (B) the amino resin to (C) the alkali-soluble resin (B/C; mass ratio) being in the range of from 1 to 10.

According to another aspect of the invention, there is provided a color filter that includes a colored pattern formed on a support using the colored curable composition for a color filter.

According to another aspect of the invention, there is provided a method for producing a color filter, the method including:

applying the colored curable composition for a color filter onto a support, and pattern exposing and developing a coating layer formed by applying the colored curable composition to form a colored pattern.

According to still another aspect of the invention, there is provided a solid state imaging device that includes the above color filter.

The invention provides a colored curable composition for a color filter excellent in dispersibility of pigment and pattern formation properties (photolithography capability).

The invention also provides a color filter having a high resolution and a favorable pattern shape (particularly rectangular properties of a pattern in the case of solid state imaging devices) and a method for producing the same.

The invention also provides a solid state imaging device excellent in color reproduction properties.

DETAILED DESCRIPTION OF THE INVENTION

Hereinafter, a colored curable composition for a color filter of the invention, a color filter using the same and a method for producing the same, and a solid state imaging device will be described in detail.

<Colored Curable Composition for a Color Filter>

The colored curable composition for a color filter of the invention (hereinafter also simply referred to as a "colored curable composition") contains at least (A) a pigment in an amount of from 35 to 70 mass % with respect to the total solid content of the colored curable composition, (B) an amino resin, (C) an alkali-soluble resin, (D) a polymerizable monomer, and (E) a photopolymerization initiator, in which the proportion of (B) the amino resin to (C) the alkali-soluble resin (B/C; mass ratio) is from 1 to 10.

When the pigment is contained at a high concentration of 35 mass % or more with respect to the total solid content of the colored curable composition, a simple increase in pigment concentration tends to cause a reduction in dispersibility, a reduction in curing properties caused by the reduction in the relative amount of components (photolithography components), other than pigments, that contribute to photolithography capability, and a deterioration of development discrimination between an exposed portion (cured portion) and an unexposed portion (non-cured portion) (i.e., the difference in dissolution speed during alkaline development between an exposed area that is not to be removed by development and an unexposed area that is to be removed by development). However, in the invention, an effect of adsorbing the pigment is enhanced while maintaining developability, by using the amino resin as a dispersant, which contributes to an increase in dispersibility of pigment, and increasing the proportion of the amino resin to the alkali-soluble resin to a specified range. Therefore, the dispersibility of pigment contained at a high concentration can be maintained, and the capability of patterning by exposure and development, i.e., the capability of forming a colored pattern (photolithography capability) can be improved. Thus, the colored curable composition is particularly effective for the formation of a color filter for a solid state imaging device which requires a favorable rectangular cross-sectional profile, is in the form of a thin film (e.g., thickness of 1 μm or less), and has a very small pixel pattern size (the length of a side of the pixel pattern as viewed from the direction normal to the main surface of the substrate) of 2 μm or less, for example from 0.5 to 2.0 μm.

In particular, when an amino resin having an acidic group having a pKa of 14 or less is used as a dispersant, the dispersant also has the development function that is otherwise imparted by the alkali-soluble resin which contributes to developability and which is to be additionally used at the time of dispersing. As a result, the amount of the alkali-soluble resin can be further reduced. Therefore, a required amount of curable components (components that contribute to photolithography capability) when the concentration of the pigment is increased (i.e., when the thickness of a color filter is reduced) can be further ensured. Thus, even when the pigment is contained at a high concentration, the capability of patterning by exposure and development, i.e., the capability of forming a colored pattern (image) (photolithography capability) can be further increased while maintaining the dispersibility of the pigment.

(A) Pigment

The colored curable composition for a color filter of the invention contains at least one pigment. By containing a pigment, a pattern colored in a desired hue is obtained.

In the invention, the content of the pigment in the colored curable composition is adjusted to be in the range of from 35 to 70 mass % with respect to the total solid content of the composition. When the pigment amount is in this range, a required color density and a required hue (particularly the density and hue of green color) are obtained even when a small thickness as in latest color filters is adopted (a thickness of 1 μm or less in the case of a color filter for solid state imaging device, in particular). In other words, a pigment amount of less than 35 mass % does not provide a required color density or hue for coloring when the thickness is reduced (e.g., 1 μm or less) although dispersibility and photolithography properties can be maintained at the pigment amount of less than 35 mass %. When the pigment amount exceeds 70 mass %, the amount of components that contributes to photolithography capability is excessively small, and thus desired curing properties and a desired pattern shape (particularly rectangularity) are not obtained. According to the invention, the dispersibility and the capability of forming a colored pattern can be enhanced when the pigment concentration is increased, in consideration of quantitative balance of other components such as curable components, to such an extent that the photolithography capability is still maintained.

As the pigment, known various inorganic pigments or organic pigments may be suitably selected.

In view of achieving a high transmittance of a color filter, which is a suitable application of the colored curable composition, organic pigments are preferable, and, regarding the particle size of the pigment, pigments having a particle size as small as possible are preferable. From the viewpoint of the handling properties of the colored curable composition, pigments having an average primary particle diameter of 100 nm or less are preferable, pigments having an average primary particle diameter of 30 nm or less are more preferable, and pigments having an average primary particle diameter of from 5 to 25 nm are the most preferable. When the average primary particle diameter of the pigment is in the range above, a color filter having a high transmittance, favorable color properties, and also a high contrast can be formed. The average primary particle diameter is determined by observing particles by SEM or TEM, measuring the particle sizes of 100 particles in a portion where the particles do not agglomerate, and then calculating the average value.

Examples of the inorganic pigments include metal compounds such as metal oxides and metal complexes. Specific examples include oxides of metals such as iron, cobalt, aluminum, cadmium, lead, copper, titanium, magnesium, chromium, zinc, or antimony, and complex oxides of the metals mentioned above.

Examples of the organic pigments include C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279; C.I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214; C.I. Pigment Orange 2, 5, 13, 16, 17:1, 31, 34, 36, 38, 43, 46, 48, 49, 51, 52, 55, 59, 60, 61, 62, 64, 71, and 73; C.I. Pigment Green 7, 10, 36, 37, and 58; C.I. Pigment Blue 1, 2, 15, 15:1, 15:2, 15:3, 15:4, 15:6, 16, 22, 60, 64, 66, 79, and a pigment in which a Cl substituent of C.I. Pigment Blue 79 has been replaced by OH; C.I. Pigment Violet 1, 19, 23, 27, 32, 37, and 42; C.I. Pigment Brown 25 and 28; and C.I. Pigment Black 1 and 7. However, in the invention, the organic pigments are not limited to the above.

Among the above, examples of preferable pigments include C.I. Pigment Yellow 11, 24, 108, 109, 110, 138, 139, 150, 151, 154, 167, 180, and 185, C.I. Pigment Orange 36 and 71, C.I. Pigment Red 122, 150, 171, 175, 177, 209, 224, 242, 254, 255, and 264, C.I. Pigment Violet 19, 23, and 32, C.I. Pigment Blue 15:1, 15:3, 15:6, 16, 22, 60, and 66, C.I. Pigment Green 7, 36, 37, and 58, and C.I. Pigment Black 1 and 7.

These organic pigments may be used singly, or may be used in combination of two or more kinds thereof in order to increase the color purity. Specific examples of preferable organic pigments and specific examples of the combination of the pigments include the following.

For example, as a red pigment, an anthraquinone pigment, a perylene pigment, or a diketopyrrolopyrrole pigment may be used singly; or a mixture of at least one of these red pigments with a disazo yellow pigment, an isoindoline yellow pigment, a quinophthalone yellow pigment, a perylene red pigment, an anthraquinone red pigment, or a diketopyrrolopyrrole red pigment may be used. Examples of anthraquinone pigments include C.I. Pigment Red 177. Examples of perylene pigments include C.I. Pigment Red 155 and C.I. Pigment Red 224. Examples of diketopyrrolopyrrole pigments include C.I. Pigment Red 254. In consideration of color reproducibility, a mixture at least one of the above red pigments with C.I. Pigment Yellow 83, C.I. Pigment Yellow 139, or C.I. Pigment Red 177 is preferable. The mass ratio of pigments other than red pigments to red pigments is preferably in the range of from 5/100 to 80/100. When the mass of other pigments is 5/100 of the mass of red pigments or more, the light transmittance of from 400 nm to 500 nm is suppressed, thereby increasing the color purity. When the mass ratio of other pigments is 80/100 of the mass of red pigments or less, the color developability is excellent. In particular, a mass ratio in the range of from 10/100 to 65/100 is appropriate. When red pigments are combined, the mass ratio thereof can be adjusted according to the desired chromaticity.

As a green pigment, a halogenated phthalocyanine pigment may be used singly, or a mixture of a halogenated phthalocyanine pigment and at least one of a disazo yellow pigment, a quinophthalone yellow pigment, an azomethine yellow pigment, or an isoindoline yellow pigment, may be used. Preferable examples of the mixture include a mixture of at least one of C.I. Pigment Green 7, C.I. Pigment Green 36, C.I. Pigment Green 37, or C.I. Pigment Green 58 with C.I. Pigment Yellow 83, C.I. Pigment Yellow 138, C.I. Pigment Yellow 139, C.I. Pigment Yellow 150, C.I. Pigment Yellow 180, or C.I. Pigment Yellow 185. The mass ratio of yellow pigments to green pigments is preferably in the range of from 5/100 to 200/100. When the mass of yellow pigments is 5/100 of the mass of green pigments or more, the light transmittance at a wavelength of from 400 to 450 nm is suppressed, thereby increasing the color purity. When the mass of yellow pigments is 200/100 of the mass of green pigments or less, the dominant wavelength does not shift toward a longer wavelength, and thus a shift from an NTSC target hue can be suppressed. In particular, a mass ratio in the range of from 20/100 to 150/100 is particularly preferable.

As a blue pigment, a phthalocyanine pigment may be used singly, or a mixture of a phthalocyanine pigment and a dioxazine purple pigment may be used. For example, a mixture of C.I. Pigment Blue 15:6 and C.I. Pigment Violet 23 is preferable. The mass ratio of purple pigments to blue pigments is preferably in the range of from 0/100 to 100/100, and more preferably 70/100 or lower.

As a pigment suitable for a black color image, such as a black matrix, carbon black, graphite, titanium black, iron oxide, or titanium oxide may be singly, or a mixture of two or more kinds may be used. Among the above, a combination of carbon black and titanium black is preferable. The mass ratio of titanium black to carbon black is preferably in the range of from 0/100 to 60/100. When the mass ratio is 60/100 or lower, the dispersion stability is favorable.

(B) Amino Resin

The colored curable composition for a color filter of the invention contains at least one amino resin. The amino resin is a resin having a basic group having a strong power of pigment adsorption. With a small amount of the amino resin, the dispersion stability of the pigment contained at high concentration in the composition can be improved. As a result, the ratio of curable components can be maintained, and developability can be ensured.

The amino resin may be selected from resins having, in the main chain portion thereof, nitrogen atoms derived from amino groups. Among amino resins, an amino resin having (i) a main chain portion having a nitrogen atom, (ii) a group X that has a functional group having a pKa of 14 or less and that is bonded to the nitrogen atom present in the main chain portion, and (iii) an oligomer or polymer chain Y that is present at a side chain of the main chain portion (i.e., at a side chain branched from the main chain portion) and that has a number average molecular weight of from 500 to 1,000,000 (hereinafter, this amino resin is sometimes referred to as a "specific resin") is preferable from the viewpoint of further enhancing the effects in increasing dispersibility and developability.

(i) Main Chain Portion Having a Nitrogen Atom

The specific resin in the invention contains (i) the main chain portion having a nitrogen atom. Thus, the adsorbability to the surface of the pigment is enhanced and the interaction between the pigment particles can be reduced.

The specific resin preferably has a main chain portion constituted by an oligomer or polymer containing a known amino group, and more preferably has a main chain portion constituted by an oligomer or polymer containing a primary or secondary amino group. More specifically, the oligomer or polymer containing an amino group preferably has a main chain structure selected from poly(lower-alkylene imine), polyallylamine, polydiallylamine, a metaxylenediamine-epichlorohydrin polycondensate, polyvinylamine, a 3-dialkyl aminopropyl(meth)acrylamide copolymer, a 2-dialkylaminoethyl(meth)acrylate copolymer, or the like, and most preferably have a main chain structure selected from poly(lower-alkylene imine), polyallylamine, or a 2-dialkylaminoethyl (meth)acrylate copolymer.

The poly(lower alkylene imine) may have a chain structure or a network structure. In particular, when the poly(lower-alkylene imine) has a mesh structure, dispersion stability is enhanced and raw material supply properties become high.

The number average molecular weight of the main chain portion of the specific resin in the invention is preferably from 100 to 10,000, more preferably from 200 to 5,000, and still more preferably from 300 to 2,000. In particular, a number average molecular weight in the range of from 500 to 1500 is most preferable from the viewpoint of achieving both the dispersion stability and developability. The molecular weight of the main chain portion can be determined from the proportion of the hydrogen atom integral value of the terminal group and of the main chain portion measured by nuclear magnetic resonance spectroscopy or can be determined by the measurement of the molecular weight of the oligomer or polymer containing an amino group as a raw material.

The main chain portion of the specific resin is preferably constituted by poly(lower-alkylene imine) or a polyallylamine skeleton. The expression "lower" used in the poly (lower-alkylene imine) indicates that the number of carbon atoms is 1 to 5, and the lower-alkylene imine represents an alkylene imine having 1 to 5 carbon atoms.

It is preferable that the dispersant itself has the development function that is otherwise imparted by an alkali-soluble resin which is used additionally and which contributes to developability and thus the amount of the alkali-soluble resin is reduced to further ensure the required content of the components contributing to photolithography capability. From this viewpoint, it is preferable for the specific resin to contain a structure containing a repeating unit represented by Formula (I-1) and a repeating unit represented by Formula (I-2). It is also preferable for the specific resin to contain a structure containing a repeating unit represented by Formula (I-1) and a repeating unit represented by Formula (I-2) and a structure containing a repeating unit represented by Formula (II-1) and/or a repeating unit represented by Formula (II-2). It is also preferable for the specific resin to contain a structure containing a repeating unit represented by Formula (II-1) and a repeating unit represented by Formula (II-2) but does not contain a structure containing a repeating unit represented by Formula (I-1) nor a repeating unit represented by Formula (I-2).

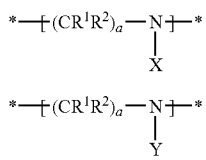

Formula (I-1)

Formula (I-2)

In Formulae (I-1) and (1-2), $R^1$ and $R^2$ each independently represent a hydrogen atom, a halogen atom, or an alkyl group; a represents an integer of 1 to 5; * represents a linking portion of each repeating unit; X represents a group having a functional group having a pKa of 14 or less; and Y represents an oligomer or polymer chain having a number average molecular weights of from 500 to 1,000,000.

It is preferable for the amino resin in the invention to further contain, in addition to the repeating unit represented by Formula (I-1) or Formula (I-2), a repeating unit represented by Formula (I-3) as a copolymerization component. By using such a repeating unit in combination, the dispersing power when the resin is used as a dispersant for a pigment or the like is further improved.

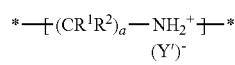

Formula (I-3)

In Formula (I-3), $R^1$, $R^2$, and a respectively have the same definitions as in Formula (I-1). Y' represents an oligomer or polymer chain having an anionic group and having a number average molecular weight of from 500 to 1,000,000. The repeating unit represented by Formula (I-3) can be formed by adding an oligomer or polymer having a group that reacts with an amine to form a salt, to a resin having a primary or secondary amino group in the main chain portion, and allowing the oligomer or polymer to react with the resin. The anionic group is preferably $CO_2^-$ or $SO_3^-$, and is most preferably $CO_2^-$. It is preferable that the anionic group is present at a terminal position of the oligomer chain or polymer chain of Y'.

In Formula (I-1), Formula (I-2), and Formula (I-3), $R^1$ and $R^2$ each particularly preferably represents a hydrogen atom, and a preferably represents 2 from the viewpoint of raw material availability.

In addition to the repeating units represented by Formula (I-1), Formula (I-2), and Formula (I-3), the specific resin may include a lower-alkylene imine containing a primary or tertiary amino group as a repeating unit. To a nitrogen atom in such a lower-alkylene imine repeating unit, the group represented by X, Y, or Y' described above may be bonded. A resin containing both a repeating unit in which the group represented by X is bonded to such a main chain structure and a repeating unit in which the group represented by Y is bonded to such a main chain structure is also included in the scope of the specific resin in the invention.

The repeating unit represented by Formula (I-1) is a repeating unit having group X, which has a functional group having a pKa of 14 or less. The repeating unit represented by Formula (I-1) is contained in an amount of preferably from 1 to 80 mol %, and most preferably from 3 to 50 mol %, with respect to all the repeating units contained in the amino resin in the invention, from the viewpoint of storage stability and developability.

The repeating unit represented by Formula (I-2) is a repeating unit having an oligomer or polymer chain Y, and the oligomer or polymer chain Y has a number average molecular weight of from 500 to 1,000,000. The repeating unit represented by Formula (I-2) is contained in an amount of from preferably 10 to 90 mol %, and most preferably 30 to 70 mol %, with respect to all the repeating units of the amino resin in the invention, from the viewpoint of storage stability.

Regarding the content ratio between both repeating units, the molar ratio of the repeating unit (I-1):the repeating unit (I-2) is preferably in the range of from 10:1 to 1:100, and more preferably in the range of from 1:1 to 1:10, from the viewpoint of dispersion stability and hydrophilicity-hydrophobicity balance.

In the repeating unit represented by Formula (I-3) that may be additionally used as desired, a partial structure containing an oligomer or polymer chain having a number average molecular weight of from 500 to 1,000,000 is ionically bonded to the nitrogen atom of the main chain portion. The repeating unit represented by Formula (I-3) is preferably contained in an amount of from 0.5 to 20 mol %, and most preferably from 1 to 10 mol %, with respect to all the repeating units of the amino resin in the invention, from the viewpoint of effects.

Infrared spectroscopy, acid value titration, or base titration may be employed to confirm that the polymer chain "Y'" is conically bonded.

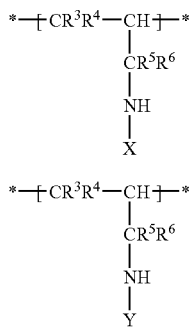

Formula (II-1)

Formula (II-2)

In Formulae (II-1) and (II-2), $R^3$, $R^4$, $R^5$, and $R^6$ each independently represent a hydrogen atom, a halogen atom, or an alkyl group, and *, X, and Y have the same definitions as *, X, and Y in Formulae (I-1) and (I-2), respectively.

It is preferable for the amino resin in the invention to further contain, in addition to the repeating units represented by Formulae (II-1) and (II-2), a repeating unit represented by Formula (II-3) as a copolymerization component. By additionally using the repeating unit represented by Formula (II-3), the dispersing power when the resin is used as a dispersant for fine particles such as pigment particles further increases.

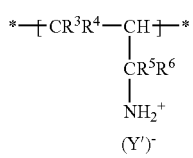

Formula (II-3)

In Formula (II-3), $R^3$, $R^4$, $R^5$, and $R^6$ have the same definitions as in Formula (II-1). Y' in Formula (II-3) has the same definition as Y' in Formula (I-3).

In Formulae (II-1), (II-2), and (II-3), $R^3$, $R^4$, $R^5$, and $R^6$ each preferably represent a hydrogen atom from the viewpoint of raw material availability.

The repeating unit represented by Formula (II-1) is a repeating unit having group X, which has a functional group having a pKa of 14 or less. The repeating unit represented by Formula (II-1) is contained in an amount of preferably from 1 to 80 mol %, and most preferably from 3 to 50 mol %, with respect to all the repeating units contained in the amino resin in the invention, from the viewpoint of storage stability and developability.

The repeating unit represented by Formula (II-2) is a repeating unit having an oligomer or polymer chain Y, and the oligomer or polymer chain Y has a number average molecular weight of from 500 to 1,000,000. The repeating unit represented by Formula (II-2) is contained in an amount of preferably from 10 to 90 mol %, and most preferably from 30 to 70 mol %, with respect to all the repeating units of the amino resin in the invention, from the viewpoint of storage stability.

Regarding the content ratio between both repeating units, the molar ratio of the repeating unit (II-1):the repeating unit (II-2) is preferably in the range of from 10:1 to 1:100, and more preferably in the range of from 1:1 to 1:10, from the viewpoint of dispersion stability and the hydrophilicity-hydrophobicity balance.

The repeating unit represented by Formula (II-3) that may be additionally used as desired is preferably contained in an amount of from 0.5 to 20 mol %, and most preferably from 1 to 10 mol %, with respect to all the repeating units of the amino resin in the invention.

The specific resin in the invention is most preferably an amino resin containing the repeating unit represented by Formula (I-1) and the repeating unit represented by Formula (I-2), from the viewpoint of pigment dispersibility.

(ii) Group "X" Having a Functional Group Having a pKa of 14 or Less

X represents a group having a functional group having a pKa of 14 or less at a water temperature of 25° C. The "pKa" described herein is as defined in Kagaku Binran (Handbook of Chemistry) (II) (4th edition, edited by Chemical Society of Japan, Maruzen, Tokyo, 1993).

The "functional group having a pKa of 14 or less" is not particularly limited in the structure and the like insofar as the properties thereof satisfy the condition. Examples thereof include known functional groups having a pKa satisfying the range above. Specific examples include carboxylic acid groups (pKa: from about 3 to about 5), sulfonic acid groups (pKa: from about −3 to about −2), phosphoric acid groups (pKa: about 2), —COCH$_2$CO— (pKa: from about 8 to about 10), —COCH$_2$CN (pKa: from about 8 to about 11), —CONHCO—, phenolic hydroxyl groups, —R$_F$CH$_2$OH or —(R$_F$)$_2$CHOH (R$_F$ representing a perfluoroalkyl group, pKa: from about 9 to about 11), and sulfonamide groups (pKa: from about 9 to about 11). In particular, carboxylic acid groups (pKa: from about 3 to about 5), sulfonic acid groups (pKa: from about −3 to about −2), and —COCH$_2$CO— (pKa: from about 8 to about 10) are preferable. The group "X" having the functional group having a pKa of 14 or less is generally directly bonded to a nitrogen atom contained in the main chain structure. However, the group "X" may be covalently bonded to the nitrogen atom of the main chain portion of the specific resin, or ionically bonded to the nitrogen atom of the main chain portion of the specific resin to form a salt. The amino resin in the invention may have two or more mutually different Xs in the molecule thereof. The molecular weight of the group "X", having a functional group having a pKa of 14 or less, is preferably from 50 to 1000, and most preferably from 50 to 500. When the molecular weight is in the range above, developability and dispersibility become favorable.

Preferable examples of the "group X having a functional group having a pKa of 14 or less" include groups having a structure represented by the following Formula (V-1), (V-2), or (V-3).

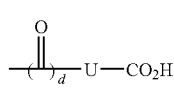

Formula (V-1)

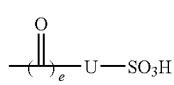

Formula (V-2)

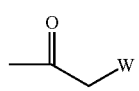

Formula (V-3)

In Formulae (V-1) and (V-2), U represents a single bond or a divalent linking group; d and e each independently represent 0 or 1. In Formula (V-3), W represents an acyl group or an alkoxycarbonyl group.

Examples of the divalent linking group represented by U include alkylene groups (more specific example thereof including —$CH_2$—, —$CH_2CH_2$—, —$CH_2CHMe$—, —$(CH_2)_5$—, and —$CH_2CH(n-C_{10}H_{21})$—), oxygen-containing alkylene groups (more specific examples thereof including —$CH_2OCH_2$— and —$CH_2CH_2OCH_2CH_2$—), cycloalkylene groups (examples thereof including cyclobutylene, cyclopentylene, cyclohexylene, and cyclooctylene), arylene groups (examples thereof including phenylene, tolylene, biphenylene, naphthylene, furanylene, and pyrrolylene), and alkyleneoxy groups (examples thereof including ethyleneoxy, propyleneoxy, and phenyleneoxy). In particular, alkylene groups having 1 to 30 carbon atoms, cycloalkylene groups having 5 to 20 carbon atoms, or arylene groups having 6 to 20 carbon atoms are preferable, and alkylene groups having 1 to 20 carbon atoms, cycloalkylene groups having 5 to 10 carbon atoms, or arylene groups having 6 to 15 carbon atoms are most preferable. From the viewpoint of productivity, d preferably represents 1 and e preferably represents 0.

W represents an acyl group or an alkoxycarbonyl group. The acyl group represented by W is preferably an acyl group having 1 to 30 carbon atoms (such as formyl, acetyl, n-propanoyl, or benzoyl), and is particularly preferably an acetyl group. The alkoxycarbonyl group represented by W is preferably an alkoxycarbonyl group having 2 to 7 carbon atoms (such as a methoxycarbonyl group, an ethoxycarbonyl group, a propoxycarbonyl group, a 1-cyclopropylethoxycarbonyl group, an i-propoxycarbonyl group, a butoxycarbonyl group, a t-butoxycarbonyl group, a pentyloxycarbonyl group, or a hexyloxycarbonyl group), and is more preferably a methoxycarbonyl group. The group represented by W is preferably an acyl group, and an acetyl group is preferable from the viewpoint of ease of production and availability of raw material (X' as a precursor of X).

"X" in the invention is bonded to the nitrogen atom of the main chain portion. Thus, the dispersibility and the dispersion stability of pigment remarkably improve. Although the reason therefor is not very clear, the following is estimated. Specifically, a nitrogen atom of the main chain portion is present in a structure of an amino group, an ammonium group, or an amide group, and such a group is considered to adsorb to an acidic portion on the surface of the pigment by an interaction such as hydrogen bonding or ionic bonding. Furthermore, since "X" functions as an acid group, "X" is able to interact with a basic portion (for example, a nitrogen atom) of the pigment or with a metal atom (for example, a copper atom of copper phthalocyanine). Therefore, it is thought that the amino resin is able to adsorb both a basic portion and an acidic portion of the pigment by a nitrogen atom and "X", and thus the adsorption capacity increases and dispersibility and storage stability remarkably increase.

Furthermore, since "X" contains a functional group having a pKa of 14 or less as a partial structure, "X" also functions as an alkali-soluble group, which is a development group that contributes to development. Therefore, when energy is applied to a film to cure some regions of the film and unexposed portions are removed by dissolution to form a pattern, the presence of "X" in the colored curable composition improves the developability of an uncured regions in a developer. It is thought that all of dispersibility, dispersion stability and developability are thereby achieved in a pigment dispersion liquid and a colored curable composition having a high pigment content or in a colored curable composition using a pigment dispersion liquid containing a ultrafine pigment.

In general, a dispersion resin containing a polycaprolactone chain has a high crystallinity as described in JP-A No. 2007-063472, and thus separates from the solvent at low temperatures. However, since the dispersion resin containing the polycaprolactone chain of the invention has unexpectedly high solvent solubility, the dispersion resin does not separate from the solvent at low temperatures. Although the reason for the above is not clear, it is considered that the solvent solubility increases due to the partial structure represented by "X" in the resin having a high affinity for the solvent.

The content of the functional group having a pKa of 14 or less of X is not particularly limited, and is preferably from 0.01 to 5 mmol, most preferably from 0.05 to 1 mmol, per 1 g of the specific resin in the invention. In this range, the dispersibility and the dispersion stability of the pigment are improved, and, when the resin is used in a curable composition, the developability of an uncured portion is excellent. Regarding the acid value, the functional group is preferably contained in an amount such that the acid value of the specific resin becomes from about 5 mgKOH/g to about 50 mgKOH/g, from the viewpoint of improving the developability when the specific resin in the invention is used in a curable composition capable of pattern formation.

The acid value titration may be performed by known methods, and, for example, an indicator method (a method of determining the neutralization point with an indicator) or potentiometry may be used. As a titrant to be used for the acid value titration, a commercially available aqueous sodium hydroxide solution may be used. However, when the acid value is difficult to measure with an aqueous sodium hydroxide solution as in the case of, for example, a functional group having a relatively high pKa (e.g., —$COCH_2CO$— or a phenolic hydroxyl group), a nonaqueous titrant such as a sodium methoxide-dioxane solution may be prepared, and the acid value may be measured using the nonaqueous solvent.

(iii) Oligomer Chain or Polymer Chain "Y"

"Y" represents an oligomer or polymer chain having a number average molecular weight of from 500 to 1,000,000. Examples of Y include known polymer chains, such as polyester, polyamide, polyimide, or poly(meth)acrylic ester, each of which is able to be connected to the main chain portion of the specific resin. The binding site of Y at which Y is connected to the specific resin is preferably a terminal of Y. The amino resin in the invention may have, within a molecule thereof, two or more kinds of "Y" (Y representing the oligomer chain or the polymer chain) that have mutually different structures.

Y is preferably bonded to the nitrogen atom of the main chain portion. The manner in which Y is bonded to the main chain portion is a covalent bond, an ionic bond, or a combination of a covalent bond and an ionic bond. With respect to the ratio of the manners of bonding of Y to the main chain portion, the ratio of covalent bond:ionic bond, in terms of the number of bonds, is in the range of from 100:0 to 0:100, preferably in the range of from 95:5 to 5:95, more preferably in the range of from 90:10 to 10:90, and most preferably in the range of from 95:5 to 80:20. Adjustment of the ratio between the bonding manners—the covalent bond and the ionic bond—in this preferable range improves dispersibility and dispersion stability and provides satisfactory solvent solubility.

It is preferable that Y forms an amide bond to the nitrogen atom of the main chain portion or is ionically bonded, as a carboxylate, to the nitrogen atom of the main chain portion.

The number average molecular weight of Y can be measured by GPC as a polystyrene-equivalent value.

The number average molecular weight of Y is particularly preferably from 1,000 to 50,000 and most preferably from 1,000 to 30,000 from the viewpoint of dispersibility, dispersion stability, and developability.

Regarding the side chain structure represented by Y, it is preferable that two or more side chains having Y are connected to the main chain in a single resin molecule, and it is most preferable that five or more side chains having Y are connected in a single resin molecule.

In particular, Y preferably has a structure represented by Formula (III-1).

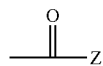

Formula (III-1)

In Formula (III-1), Z represents a polymer or oligomer having a polyester chain as a partial structure, and the polymer or oligomer represented by Formula (III-1) is a residue obtained by excluding the carboxyl group from a polyester that has a free carboxylic acid and that is represented by Formula (IV).

In Formula (IV), Z has the same definition as Z in Formula (III-1).

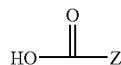

Formula (IV)

When the specific resin has a repeating unit represented by Formula (I-3) or (II-3), Y' is preferably represented by Formula (III-2).

In Formula (III-2), Z has the same definition as Z in Formula (III-1).

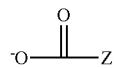

Formula (III-2)

A polyester having a carboxyl group at one terminal (polyester represented by Formula (IV)) can be obtained by (IV-1) polycondensation of a carboxylic acid and a lactone, (IV-2) polycondensation of a hydroxyl-group-containing carboxylic acid, or (IV-3) polycondensation of a dihydric alcohol and a divalent carboxylic acid (or a cyclic acid anhydride).

Examples of the carboxylic acid to be used in (IV-1) the polycondensation reaction of a carboxylic acid and a lactone include aliphatic carboxylic acids (preferably straight-chain or branched carboxylic acids having 1 to 30 carbon atoms, e.g., formic acid, acetic acid, propionic acid, butyric acid, valeric acid, n-hexanoic acid, n-octanoic acid, n-decanoic acid, n-dodecanoic acid, palmitic acid, 2-ethylhexanoic acid, and cyclohexanoic acid) and hydroxyl-group-containing carboxylic acids (preferably straight-chain or branched hydroxyl-group-containing carboxylic acids having 1 to 30 carbon atoms, e.g., glycolic acid, lactic acid, 3-hydroxypropionic acid, 4-hydroxydodecanoic acid, 5-hydroxydodecanoic acid, ricinoleic acid, 12-hydroxydodecanoic acid, 12-hydroxystearic acid, and 2,2-bis(hydroxymethyl)butyric acid). In particular, straight-chain aliphatic carboxylic acids having 6 to 20 carbon atoms or hydroxyl-group-containing carboxylic acids having 1 to 20 carbon atoms are preferable. In an embodiment, a mixture of two or more of these carboxylic acids is used. The lactone to be used may be a known lactone. Examples thereof include β-propiolactone, β-butyrolactone, γ-butyrolactone, γ-hexanolactone, γ-octanolactone, δ-valerolactone, δ-hexanolactone, δ-octanolactone, ε-caprolactone, δ-dodecanolactone, and α-methyl-γ-butyrolactone. In particular, ε-caprolactone is preferable from the viewpoint of reactivity and availability.

In an embodiment, a mixture of two or more of these lactones is used.

The blending ratio of the carboxylic acid and the lactone during the reaction cannot be uniquely determined because it depends on the molecular weight of a target polyester chain. The carboxylic acid:lactone ratio is preferably from 1:1 to 1:1,000, and most preferably from 1:3 to 1:500.

Hydroxyl-group-containing carboxylic acids in (IV-2) the polycondensation of a hydroxyl-group-containing carboxylic acid are the same as the hydroxyl-group-containing carboxylic acids mentioned in (IV-1) above, and the preferable range is also the same.

Examples of dihydric alcohols in (IV-3) the polycondensation reaction of a dihydric alcohol and a divalent carboxylic acid (or a cyclic acid anhydride) include straight-chain or branched aliphatic diols (preferably diols having 2 to 30 carbon atoms, e.g., an ethylene glycol, a diethylene glycol, a triethylene glycol, a dipropylene glycol, 1,2-propanediol, 1,3-propanediol, 1,5-pentanediol, 1,6-hexanediol, and 1,8-octanediol). In particular, aliphatic diols having 2 to 20 carbon atoms are preferable.

Examples of divalent carboxylic acids include straight-chain or branched divalent aliphatic carboxylic acids (preferably divalent aliphatic carboxylic acids having 1 to 30 carbon atoms, e.g., succinic acid, maleic acid, adipic acid, sebacic acid, dodecanedioic acid, glutaric acid, suberic acid, tartaric acid, oxalic acid, and malonic acid). In particular, divalent carboxylic acids having 3 to 20 carbon atoms are preferable. Acid anhydrides equivalent to these divalent carboxylic acids (e.g., succinic acid anhydride and glutaric acid anhydride) may be used.

It is preferable to add the divalent carboxylic acid and the dihydric alcohol in a molar ratio of 1:1. Thus, carboxylic acid can be introduced into a terminal.

The polycondensation during the production of a polyester is preferably carried out by adding a catalyst. The catalyst is preferably a catalyst capable of functioning as a Lewis acid. Examples thereof include Ti compounds (e.g., Ti(OBu)$_4$ and Ti(O—Pr)$_4$), Sn compounds (e.g., tin octylate, dibutyltin oxide, dibutyltin laurate, monobutyl tin hydroxybutyl oxide, stannic chloride, and butyltin dioxide), and protonic acids (e.g., sulfuric acid and paratoluene sulfonic acid). The catalyst amount is preferably from 0.01 to 10 mol %, and most preferably from 0.1 to 5 mol %, with respect to the total molar number of monomers. The reaction temperature is preferably from 80 to 250° C., and most preferably from 100 to 180° C. The reaction time varies depending on reaction conditions, and is generally from 1 to 24 hours.

The number average molecular weight of the polyester can be measured by GPC as a polystyrene-equivalent value. The number average molecular weight of the polyester is preferably from 1,000 to 1,000,000, more preferably from 2,000 to 100,000, and most preferably from 3,000 to 50,000. When the molecular weight is in this range, dispersibility and developability are both achieved.

The structure of the polyester portion forming the polymer chain in Y is preferably a polyester obtained by (IV-1) the polycondensation of a carboxylic acid and a lactone and (IV-2) the polycondensation of a hydroxyl-group-containing carboxylic acid, from the viewpoint of facilitating production.

Hereinafter, specific aspects [(A-1) to (A-60)] of the specific resin in the invention are shown by presenting specific structures of the repeating units of the resin and the combination of the repeating units. However, the invention is not limited thereto. In the following formulae, k, l, m, and n each represent a polymerization molar ratio of repeating unit. k represents a number of from 1 to 80, l represents a number of from 10 to 90, m represents a number of from 0 to 80, and n represents a number of from 0 to 70, and the relationship, k+l+m+n=100, is satisfied. p and q each represent the connection number of polyester chain and each independently represent a number of from 5 to 100,000. R' represents a hydrogen atom or an alkoxycarbonyl group.

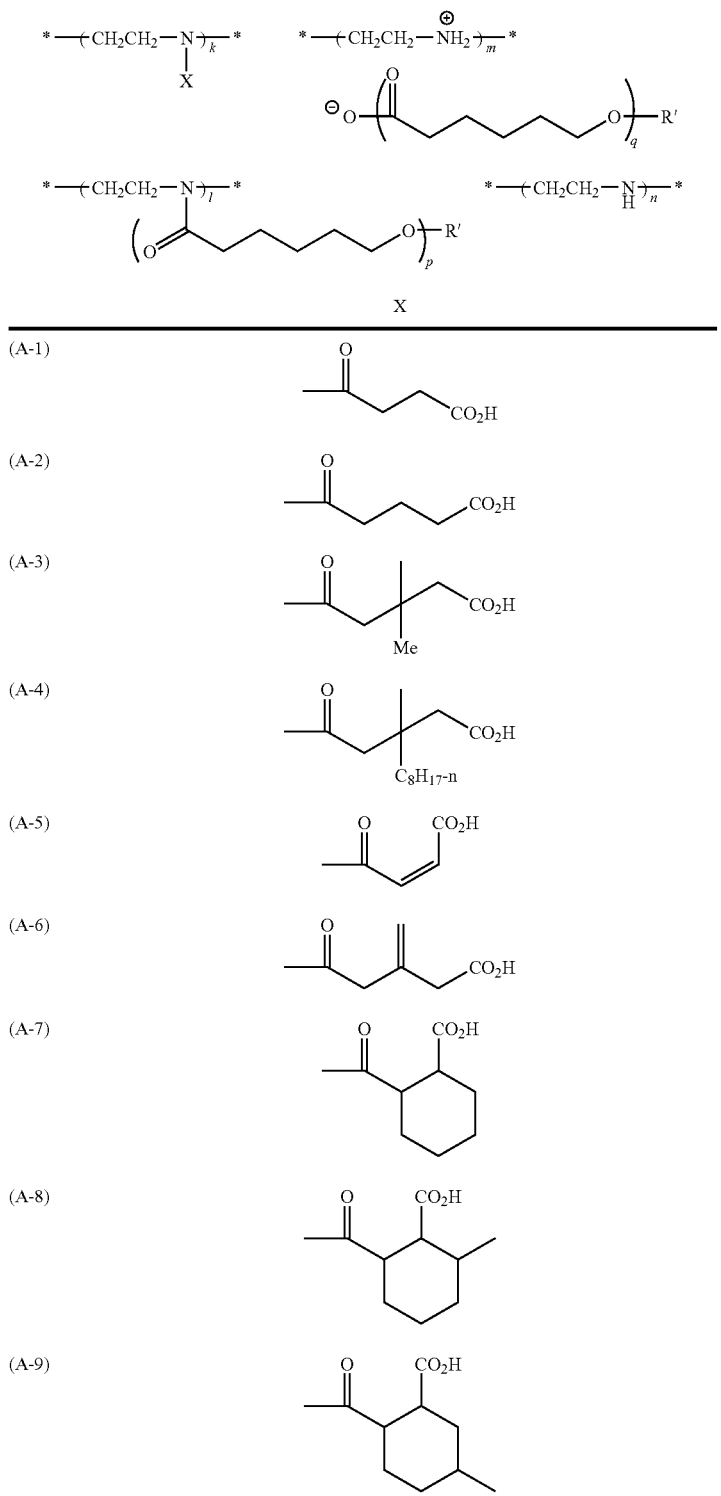

-continued
(A-10) 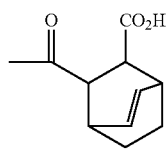
(A-11) 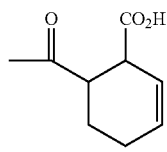
(A-12) 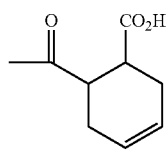
(A-13) 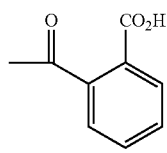
(A-14) 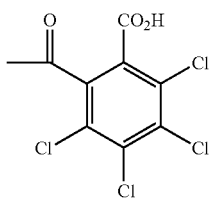 [SMILES: CC(=O)c1c(Cl)c(Cl)c(Cl)c(Cl)c1C(=O)O]
(A-15) 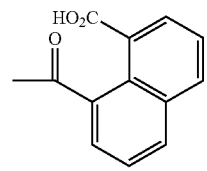 [SMILES: CC(=O)c1cccc2cccc(C(=O)O)c12]
(A-16) 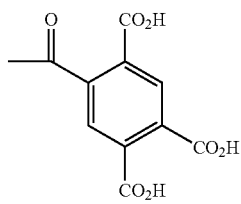 [SMILES: CC(=O)c1cc(C(=O)O)c(C(=O)O)cc1C(=O)O]
(A-17) 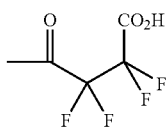
(A-18) 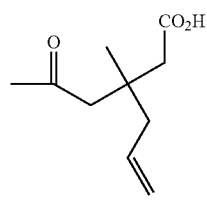

-continued
(A-19) 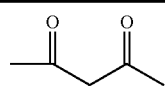
(A-20) 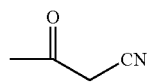
(A-21) 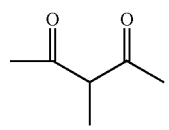
(A-22) 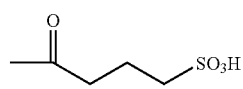
(A-23) 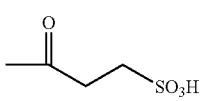
(A-24) 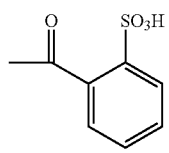
(A-25) —CH$_2$CO$_2$H
(A-26) —CH$_2$CH$_2$CO$_2$H
(A-27) 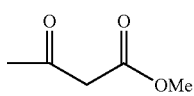
(A-28) 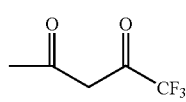
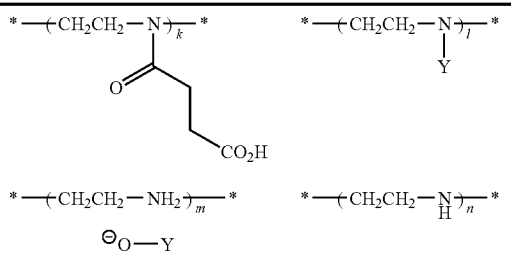
Y
(A-29) 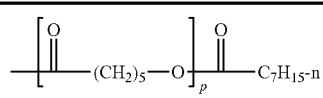
(A-30) 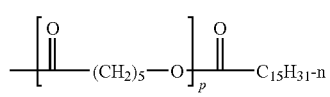
(A-31) 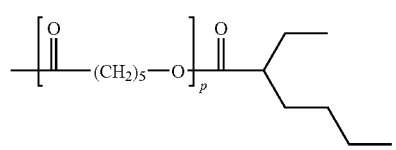

-continued
(A-32) 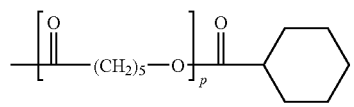
(A-33) 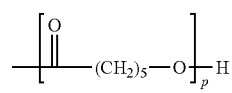
(A-34) 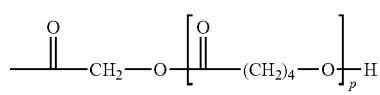
(A-35) 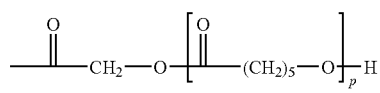
(A-36) 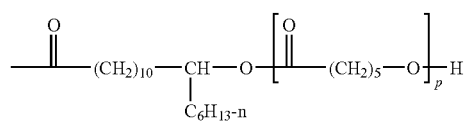
(A-37) 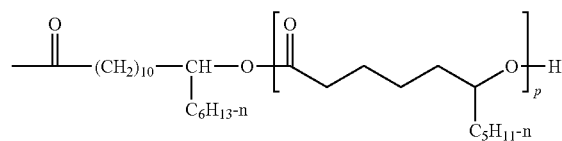
(A-38) 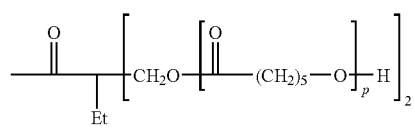
(A-39) 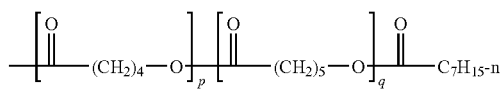
(A-40) 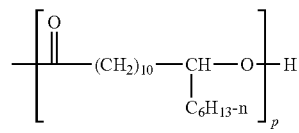
(A-41) 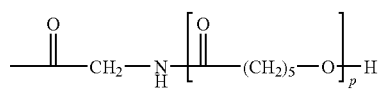
(A-42) 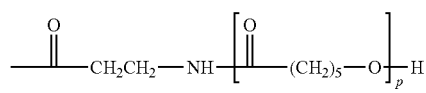

-continued
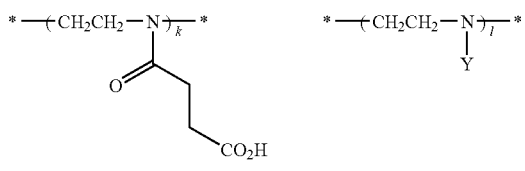
Y
(A-43) 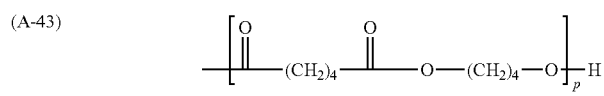
(A-44) 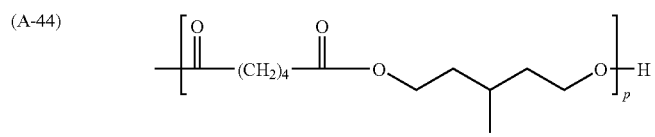
(A-45) 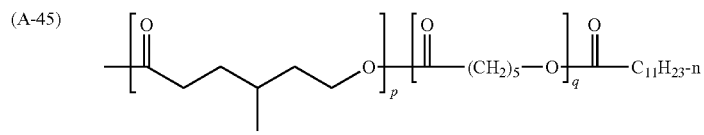
(A-46) 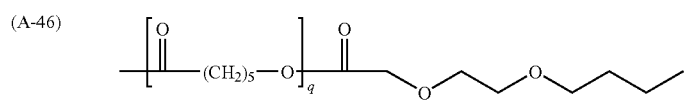
(A-47) 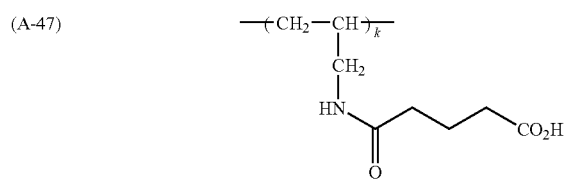
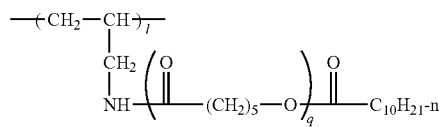
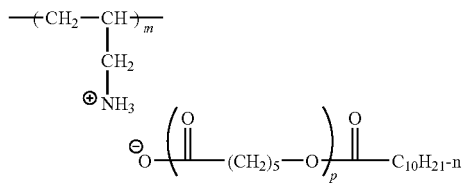
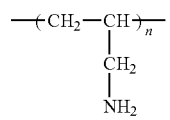

-continued
(A-48)
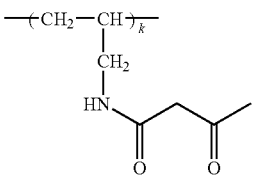
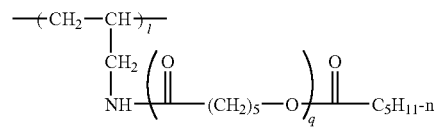
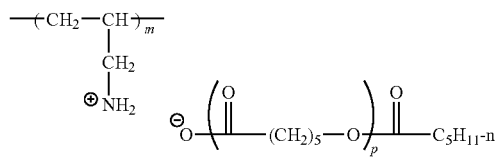
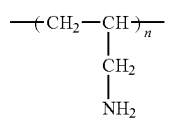
(A-49)
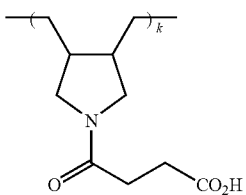
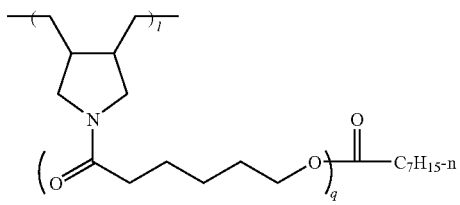
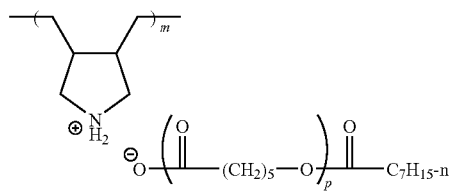
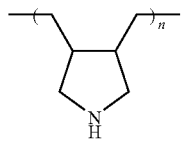
(A-50)
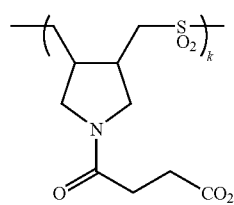

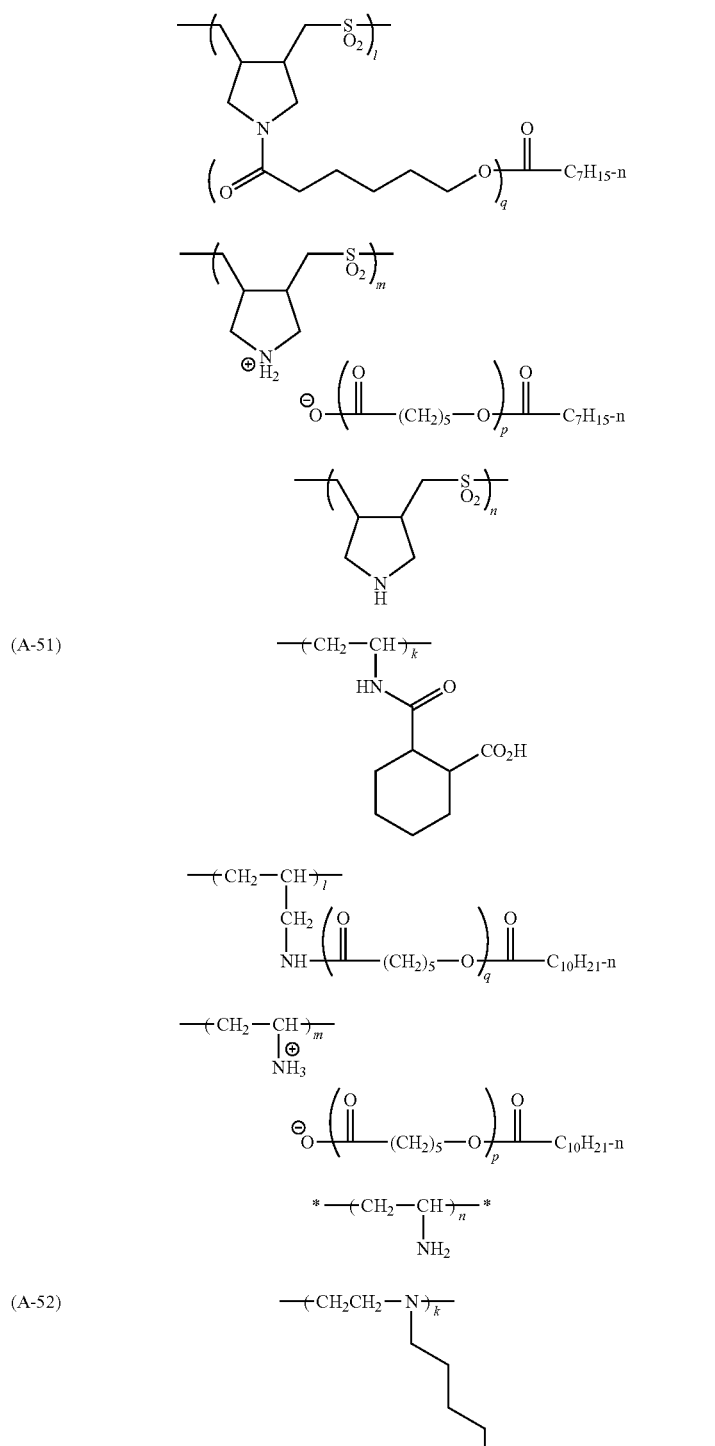
(A-51)
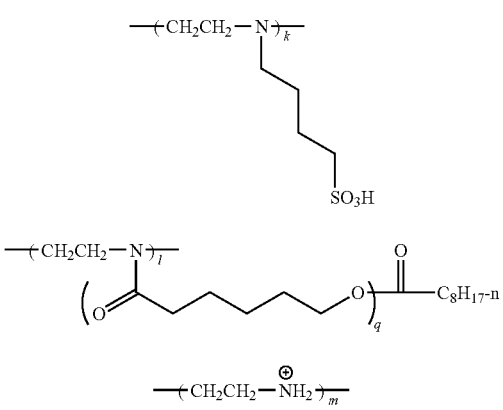
(A-52)

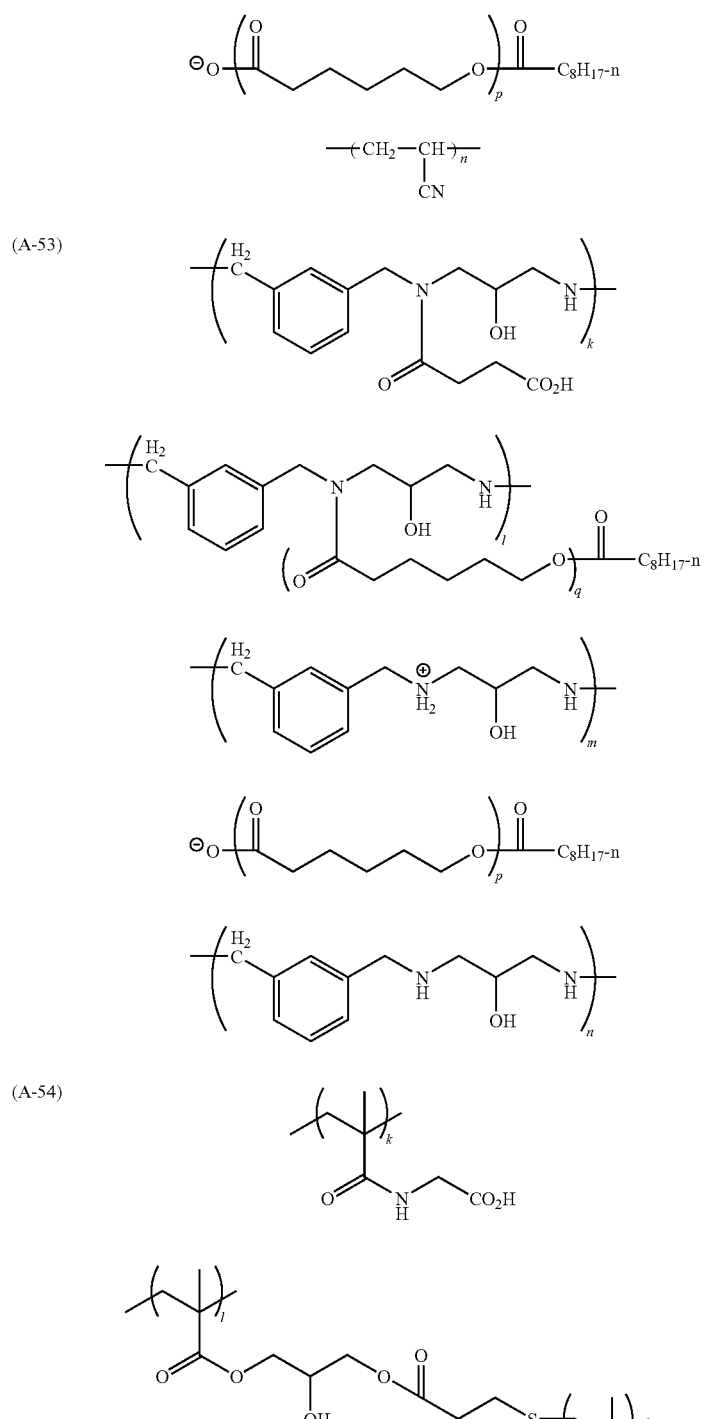

-continued
(A-55)
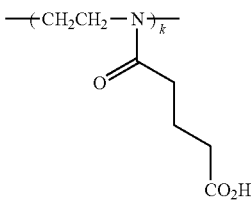
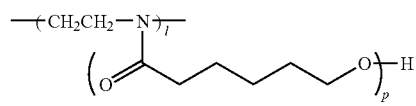
(A-56)
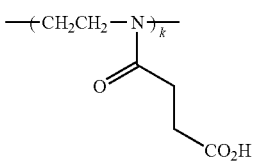
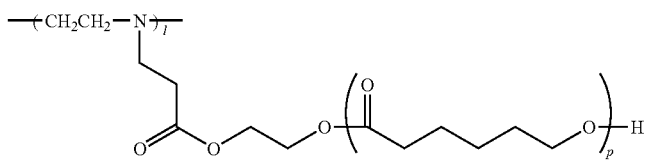
(A-57)
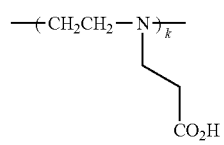
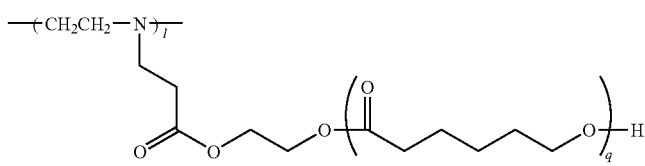
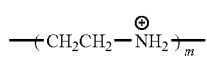
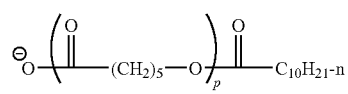
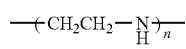
(A-58)
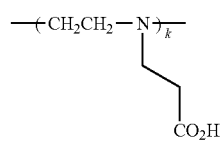
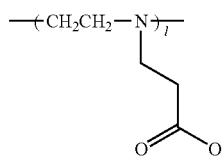 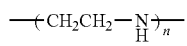
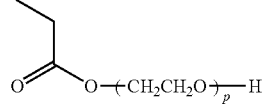

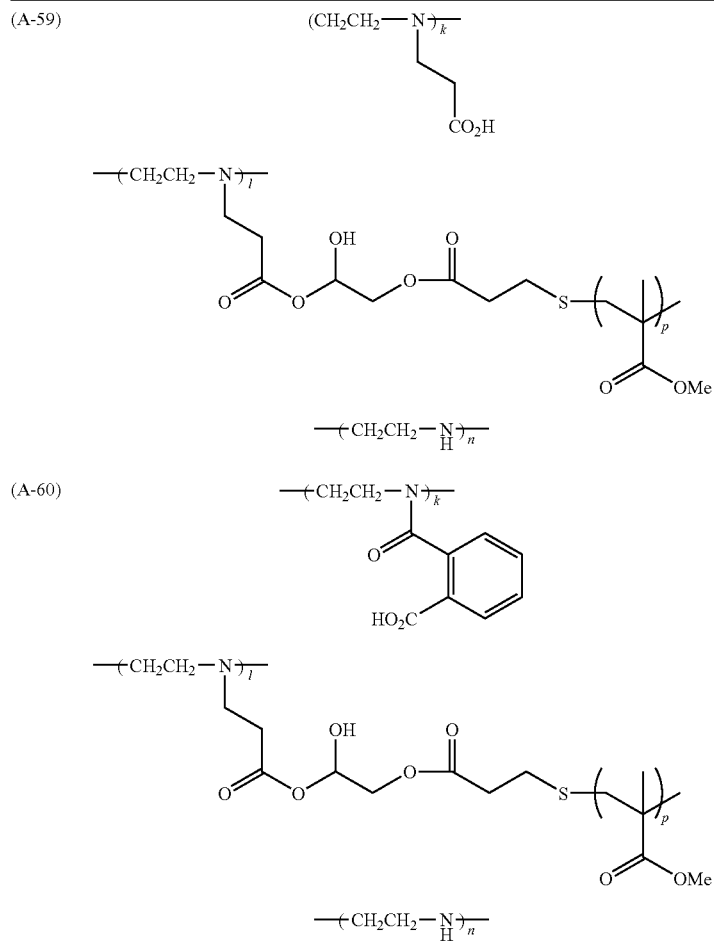

The specific resin in the invention can be produced by (1) a method of allowing a resin having a primary or a secondary amino group to react with a precursor of X and a precursor of Y and (2) a method of polymerizing a monomer containing a nitrogen atom, a monomer containing X, and a macromonomer containing Y. In the below, the precursor of X is referred to as "x", and the precursor of Y is referred to as "y". It is preferable to produce the specific resin by first synthesizing a resin having a primary or secondary amino group in the main chain portion thereof, and then allowing x, which is a precursor of X, and y, which is a precursor of Y, to react with the resin and bond to nitrogen atoms present in the main chain portion by a macromolecular reaction.

Hereinafter, (1) the method of allowing a resin having a primary or secondary amino group to react with x (a precursor of X) and y (a precursor of Y) will be described.

Examples of the resin having a primary or secondary amino group include oligomers or polymers containing a primary or secondary amino group and constituting the main chain portion having a nitrogen atom. Examples thereof include poly (lower-alkylene imine), polyallylamine, polydiallylamine, a metaxylenediamine-epichlorohydrin polycondensate, and polyvinylamine. Among the above, oligomers or polymers constituted by poly(lower-alkylene imine) or polyallylamine are preferable.

x, which is a precursor of the group "X" having a functional group having a pKa of 14 or less, refers to a compound capable of reacting with the resin having a primary or secondary amino group to introduce X into the main chain portion. Examples of x include cyclic carboxylic anhydrides (preferably cyclic carboxylic anhydrides having 4 to 30 carbon atoms, such as succinic anhydride, glutaric anhydride, itaconic anhydride, maleic anhydride, allylsuccinic anhydride, butylsuccinic anhydride, n-octylsuccinic anhydride, n-decylsuccinic anhydride, n-dodecylsuccinic anhydride, n-tetradecylsuccinic anhydride, n-docosenylsuccinic anhydride, (2-hexene-1-yl)succinic anhydride, (2-methylpropene-1-yl)succinic anhydride, (2-dodecene-1-yl)succinic anhydride, n-octenylsuccinic anhydride, (2,7-octanedien-1-yl)succinic anhydride, acetylmalic anhydride, diacetyltartaric anhydride, HET anhydride, cyclohexane-1,2-dicarboxylic anhydride, 3- or 4-methylcyclohexane-1,2-dicarboxylic anhydride, tetrafluorosuccinic anhydride, 3- or 4-cyclohexene-1,2-dicarboxylic anhydride, 4-methyl-4-cyclohexene-1,2-dicarboxylic anhydride, phthalic anhydride, tetrachlorophthalic anhydride, naphthalic anhydride, bicyclo [2.2.2]oct-7-ene-2,3,5,6-tetracarboxylic dianhydride, pyromellitic dianhydride, meso-butane-1,2,3,4-tetracarboxylic dianhydride, and 1,2,3,4-cyclopentane carboxylic dianhydride), halogen-atom-containing carboxylic acids (such as chloroacetic acid, bromoacetic acid, iodoacetic acid, and 4-chloro-n-butyric acid), sultones (such as propanesultone and 1,4-butanesultone), diketene, cyclic sulfocarboxylic anhydrides'(such as 2-sulfobenzonic acid anhydride), compounds containing COCH$_2$COCl (such as ethyl malonyl chloride), and cyanoacetate chloride. In particular, cyclic carboxylic anhydrides, sultones, and diketene are preferable from the viewpoint of productivity.

y, which is a precursor of the oligomer or polymer chain "Y" having a number average molecular weight of from 500 to 1,000,000, is a compound capable of reacting with the resin having a primary or secondary amino group to introduce "Y."

y is preferably an oligomer or polymer having a number average molecular weight of from 500 to 1,000,000 and having, at a terminal, a group that can be covalently bonded or ionically bonded to a nitrogen atom of the specific resin. In particular, oligomers or polymers having a number average molecular weight of from 500 to 1,000,000 and having a free carboxy group at one terminal are most preferable.

Examples of y include a polyester having a free carboxylic acid at one terminal and represented by Formula (IV), a polyamide having a free carboxylic acid at one terminal, and a poly(meth)acrylic resin having a free carboxylic acid at one terminal. In particular, a polyester containing a free carboxylic acid at one terminal and represented by Formula (IV) is most preferable.

y may be synthesized by known methods. As described above, examples of the method for producing the polyester that contains a free carboxylic acid at one terminal and is represented by Formula (IV) include (IV-1) polycondensation of a carboxylic acid and a lactone, (IV-2) polycondensation of a hydroxyl-group-containing carboxylic acid, and (IV-3) polycondensation of a dihydric alcohol and a divalent carboxylic acid (or cyclic acid anhydride). The polyamide containing a free carboxylic acid at one terminal can be produced by self-condensation of an amino-group-containing carboxylic acid (e.g., glycine, alanine, β-alanine, or 2-aminobutyric acid). A poly(meth)acrylic ester having a free carboxylic acid at one terminal may be produced by radical polymerization of a (meth)acrylic monomer in the presence of a carboxyl-group-containing chain transfer agent (e.g., 3-mercaptopropionic acid).

The specific resin in the invention can be produced by (a) a method of allowing x and y to simultaneously react with a resin having a primary or secondary amino group, (b) a method of allowing x to react with a resin having a primary or secondary amino group and then allowing the resultant to react with y, or (c) a method of allowing y to react with a resin having a primary or secondary amino group and then allowing the resultant to react with x. In particular, the method of allowing y to react with a resin having a primary or secondary amino group and the allowing the resultant to react with x is preferable.

The reaction temperature may be suitably selected depending on the conditions, and is preferably from 20 to 200° C. and most preferably from 40 to 150° C. The reaction time is preferably from 1 to 48 hours, and more preferably from 1 to 24 hours, from the viewpoint of productivity.

The reaction may be performed in the presence of a solvent. Examples of the solvent include water, sulfoxide compounds (e.g., dimethyl sulfoxide), ketone compounds (e.g., acetone, methyl ethyl ketone, and cyclohexanone), ester compounds (e.g., ethyl acetate, butyl acetate, ethyl propionate, and propyleneglycol 1-monomethyl ether 2-acetate), ether compounds (e.g., diethyl ether, dibutyl ether, and tetrahydrofuran), aliphatic hydrocarbon compounds (e.g., pentane and hexane), aromatic hydrocarbon compounds (e.g., toluene, xylene, and mesitylene), nitryl compounds (e.g., acetonitrile and propionenitrile), amide compounds (e.g., N,N dimethylformamide, N,N-dimethylacetamide, and N-methylpyrrolidone), carboxylic acid compounds, (e.g., acetic acid and propionic acid), alcohol compounds (e.g., methanol, ethanol, isopropanol, n-butanol, 3-methylbutanol, and 1-methoxy-2-propanol), and halogen solvents (e.g., chloroform and 1,2-dichloroethane).

When the solvent is used, the weight of the solvent to be used is preferably from 0.1 times to 100 times the weight of the substrate, and is more preferably from 0.5 times to 10 times the weight of the substrate.

The specific resin in the invention may be purified by a re-precipitation method. Removal of low molecular weight components by the re-precipitation method improves the dispersing properties when the obtained specific resin is used as a pigment dispersant.

For the re-precipitation, hydrocarbon solvents, such as hexane, or alcohol solvents, such as methanol, are preferably used.

Next, (2) the method of polymerizing a monomer containing a nitrogen atom, a monomer containing X, and a macromonomer containing Y will be described.

The monomer containing a nitrogen atom to be used in the method may be selected from known monomers. Examples thereof include 2-dialkylaminoethyl(meth)acrylate, 3-dialkylaminopropyl(meth)acrylamide, vinylpyridine, and N-vinylimidazole. In particular, monomers containing a tertiary amino group are preferable, and 2-dialkylaminoethyl (meth)acrylate and 3-dialkylaminopropyl(meth)acrylamide are most preferable.

The monomer containing X is preferably a (meth)acrylamide containing X, and preferable examples include amino acids containing a (meth)acryloyl group, such as N-(meth) acryloyl glycine or N-(meth)acryloyl alanine.

Examples of the macromonomer containing Y include known macromonomers, and macromonomers having a polymerizable group at one terminal of poly(meth)acrylic ester, polystyrene, or polyester are preferable. Preferable examples thereof include AA-6 (trade name, polymethyl methacrylate whose terminal group is a methacryloyl group), AS-6 (trade name, polystyrene whose terminal group is a methacryloyl group), AN-6S (trade name, a copolymer of styrene and acrylonitrile, whose terminal group is a methacryloyl group), and AB-6 (trade name, polybutyl acrylate whose terminal group is a methacryloyl group), all of which are macromonomers manufactured by TOAGOSE Co., Ltd.; PLACCEL FM5 (trade name, a product in which 5 mol-equivalent of ε-caprolactone is added to 2-hydroxyethyl methacrylate), FA10L (trade name, a product in which 10 mol-equivalent of ε-caprolactone is added to 2-hydroxyethyl acrylate) manufactured by DAICEL CHEMICAL INDUSTRIES, LTD.; and a polyester macromer described in JP-A No. 2-0272009.

The polymerization is preferably performed in a nitrogen atmosphere using a radical polymerization initiator. The radical polymerization initiator may be a known radical polymerization initiator, and azobisisobutyronitrile and methyl 2,2'-azobisisobutyrate are preferable from the viewpoint of the adjustment of the molecular weight or handling properties.

The radical polymerization initiator is preferably used preferably in an amount of from 0.01 mol % to 10 mol %, and most preferably in an amount of from 0.1 mol % to 5 mol %, with respect to the total mole number of the monomers.

In order to adjust the molecular weight, a chain transfer agent may be added. The chain transfer agent is particularly preferably a thiol compound, and preferable examples thereof include an alkanethiol having 5 to 20 carbon atoms, 2-mercaptoethanol, and 2-mercaptopropionic acid.

The chain transfer agent is preferably used in an amount of from 0.01 mol % to 10 mol %, and most preferably in an amount of from 0.1 mol % to 5 mol %, with respect to the total number of the monomers. The reaction temperature is preferably from 60 to 100° C., and most preferably from 70 to 90° C.

Examples of the reaction solvent include the solvents mentioned in (1) the method for reacting the resin having a primary or secondary amino group and x as the precursor of X and y as the precursor of Y.

The thus-obtained resin in the invention has a weight average molecular weight as measured by GPC of preferably from 3,000 to 100,000, and more preferably from 5,000 to 50,000. The molecular weight in the range above is advantageous in that high developability and high storage stability can be achieved. In the specific resin in the invention, the presence of (i) a nitrogen atom in the main chain portion can be confirmed by, for example, acidimetry, the presence of (ii) the functional group having a pKa of 14 or less and the bonding of the functional group to the nitrogen atom present in the main chain portion can be confirmed by, for example, base titration, nuclear magnetic resonance spectroscopy, or infrared spectroscopy, and (iii) the presence of the oligomer or polymer chain "Y" having a number average molecular weight of from 500 to 1,000,000 at a side chain can be confirmed by, for example, nuclear magnetic resonance spectroscopy or GPC.

Specific examples of the specific resin in the invention are shown below, together with the molecular weights thereof.

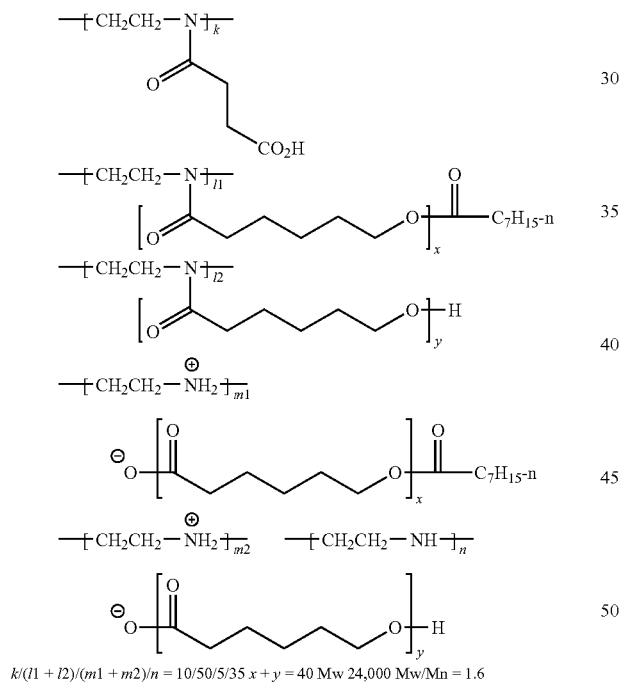

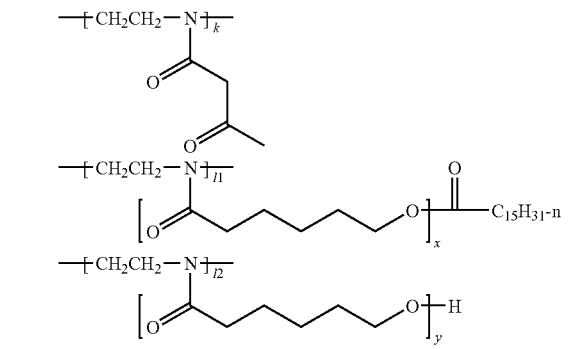

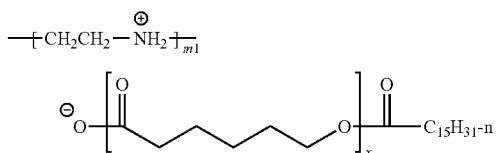

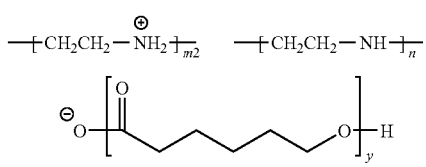

$k/(l1 + l2)/(m1 + m2)/n = 20/40/5/35\ x + y = 60$ Mw 18,000 Mw/Mn = 1.6

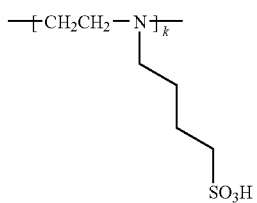

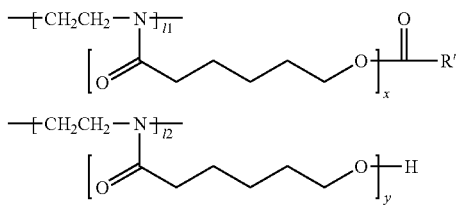

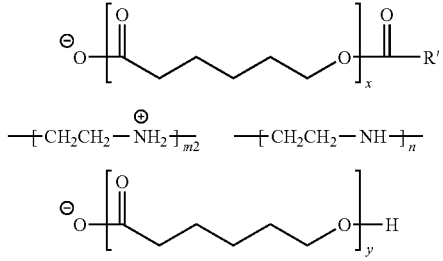

$k/(l1 + l2)/(m1 + m2)/n = 5/60/10/25\ x + y = 20$ Mw 12,000 Mw/Mn = 1.6

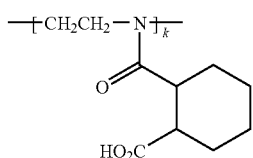

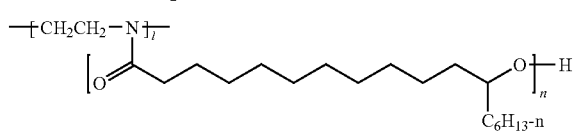

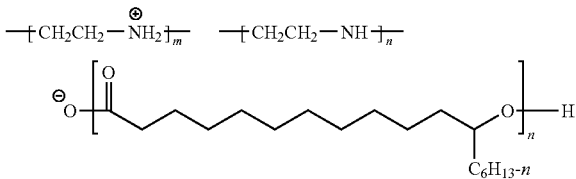

$k/l/m/n = 5/30/7/58$ Mw 15,000 Mw/Mn = 2.2

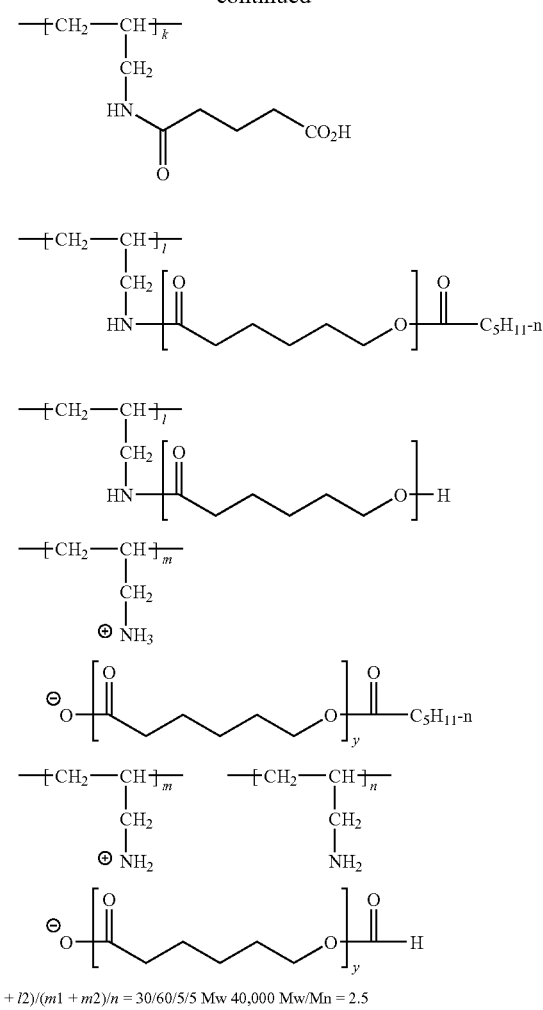

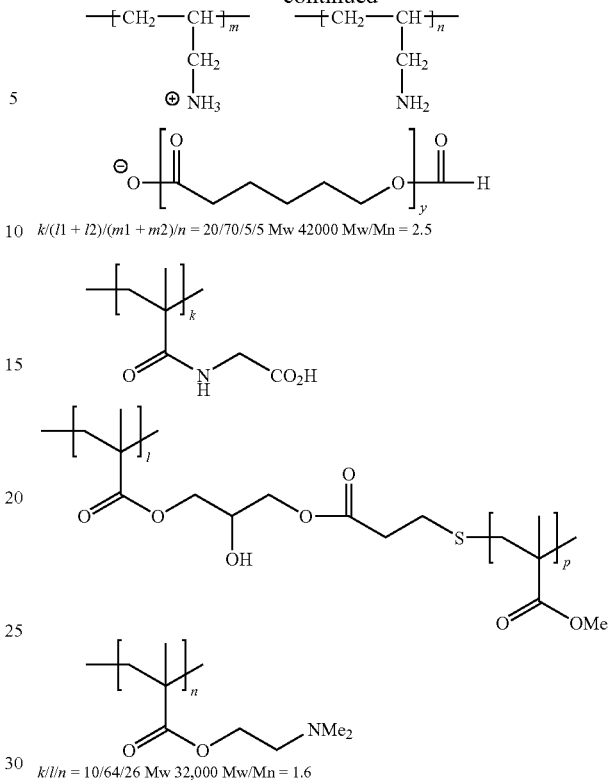

In the invention, the amino resin is contained such that the proportion of (B) the amino resin to (C) an alkali-soluble resin described below (B/C; mass ratio) is in the range of from 1 to 10. When the B/C ratio is lower than 1, the content of the amino resin to be contained as a dispersant is excessively low, and the dispersibility of the pigment cannot be maintained; moreover, the resolution when a pattern is formed decreases, and desired photolithography capability cannot be maintained. When the B/C ratio exceeds 10, the proportion of the amino resin to the alkali-soluble resin is excessively high, as a result of which the developability deteriorates, the resolution when a pattern is formed decreases, and desired photolithography capability cannot be maintained.

In particular, the B/C ratio is preferably in the range of from 1 to 5, and more preferably in the range of from 1 to 3, from the viewpoint of improving both the dispersibility of the pigment and the ability to form a colored pattern (photolithography capability), and, particularly, increasing the pattern rectangular properties when a color filter for a solid state imaging device is formed.

The content of the amino resin in the colored curable composition is preferably in the range of from 12.5 to 22.5 mass %, and more preferably in the range of from 15.0 to 20.0 mass %, with respect to the total solid content of the composition. When the content of the amino resin is in the range above, the dispersion can be stabilized, and the patterning properties (photolithography capability) by exposure and development, particularly pattern rectangular properties when a color filter for a solid state imaging device is formed, can be increased in a composition system whose pigment concentration is 35 mass % or more with respect to the total mass.

The ratio of the total amount of (B) the amino resin and (C) the alkali-soluble resin described below to (A) the pigment described above ((B+C)/A; mass ratio) is preferably in the range of from 0.3 to 0.5. When the (B+C)/A ratio is 0.3 or more, both the dispersibility of the pigment contained at a high concentration and the developability during development (development discrimination between an exposed portion (cured portion) and an unexposed portion (uncured portion)) can be achieved, and the photolithography capability with which a colored pattern in a desired shape (e.g., favorable rectangular shape in the case of color filter for solid state imaging device) can be obtained can be secured. Further, a (B+C)/A ratio of 0.5 or lower is advantageous in terms of maintaining the amount of curable components in a composition containing a pigment at a high concentration.

In particular, the (B+C)/A ratio is preferably in the range of from 0.3 to 0.5, and more preferably in the range of from 0.4 to 0.5, for reasons similar to those described above.

(C) Alkali-Soluble Resin

The colored curable composition for a color filter of the invention contains at least one alkali-soluble resin. The alkali-soluble resin is not particularly limited insofar as it is alkali-soluble, and is preferably selected from the viewpoints of, for example, heat resistance, development properties, and availability.

The alkali-soluble resin is preferably a linear organic high-molecular polymer that is soluble in an organic solvent and that can be developed using a weakly-alkaline aqueous solution. Examples of such a linear organic high-molecular polymer include polymers having carboxylic acid at a side chain thereof, such as methacrylic acid copolymers, acrylic acid copolymers, itaconic acid copolymers, crotonic acid copolymers, maleic acid copolymer, and partially esterified maleic acid copolymers, such as those described in, for example, JP-A No. 59-044615, JP-B Nos. 54-034327, 58-012577, and 54-025957, and JP-A Nos. 59-053836 and 59-071048. Acidic cellulose derivatives having carboxylic acid at a side chain thereof are also useful.

In addition to the above, useful examples of the alkali-soluble resin further include a resin in which an acid anhydride is added to a hydroxyl-group-containing polymer, a polyhydroxystyrene resin, a polysiloxane resin, poly(2-hydroxyethyl(meth)acrylate), polyvinylpyrrolidone, polyethylene oxide, and polyvinyl alcohol.

The linear organic high-molecular polymer may be obtained by copolymerizing monomers including a hydrophilic monomer. Examples of the hydrophilic monomer include alkoxyalkyl(meth)acrylate, hydroxyalkyl(meth) acrylate, glycerol (meth)acrylate, (meth)acrylamide, N-methylolacrylamide, secondary or tertiary alkylacrylamide, dialkylamino alkyl(meth)acrylate, morpholine (meth)acrylate, N-vinylpyrrolidone, N-vinylcaprolactam, vinylimidazole, vinyltriazole, methyl(meth)acrylate, ethyl (meth)acrylate, branched or straight-chain propyl(meth)acrylate, branched or straight-chain butyl(meth)acrylate, or phenoxy hydroxypropyl(meth)acrylate. Examples of the hydrophilic monomer further include monomers containing at least one of a tetrahydrofurfuryl group, a phosphoric acid group, a phosphoric ester group, a quarternary ammonium salt group, an ethyleneoxy chain, a propyleneoxy chain, a group derived from sulfonic acid or a salt thereof, and a morpholino ethyl group.

The alkali-soluble resin may have an ethylenic unsaturated bond as a polymerizable group (preferably at a side chain) in order to increase the crosslinking efficiency. Therefore, examples of useful alkali-soluble resins include polymers having (preferably at a side chain thereof) at least one of an allyl group, a (meth)acrylic group, an allyloxyalkyl group or the like. Examples of polymers having a polymerizable group include commercially available KS RESIST-106 (trade name, manufactured by OSAKA ORGANIC CHEMICAL INDUSTRY, LTD.) and CYCLOMER P SERIES (trade name, manufactured by Daicel Chemical Industries, Ltd.). From the viewpoint of increasing the strength of a cured film, alcohol-soluble nylon, polyether of 2,2-bis-(4-hydroxyphenyl)-propane and epichlorohydrin, or the like is also useful.

Among the various alkali-soluble resins, a polyhydroxystyrene resin, a polysiloxane resin, an acrylic resin, an acrylamide resin, and an acryl/acrylamide copolymer resin are preferable from the viewpoint of heat resistance. From the viewpoint of controlling the development properties, an acrylic resin, an acrylamide resin, and an acryl/acrylamide copolymer resin are preferable. Preferable examples of the acrylic resin include copolymers obtained by polymerization of at least one monomer selected from benzyl(meth)acrylate, (meth)acrylic acid, hydroxyethyl(meth)acrylate, (meth)acrylamide, or the like, commercially available KS RESIST-106 (trade name, manufactured by OSAKA ORGANIC CHEMICAL INDUSTRY, LTD.), and CYCLOMER P SERIES (trade name, manufactured by Daicel Chemical Industries, Ltd.). From the viewpoints of, for example, developability and liquid viscosity, the alkali-soluble resin is preferably a polymer having a weight average molecular weight (polystyrene-equivalent value as measured by GPC) of from 1000 to $2 \times 10^5$, more preferably a polymer having a weight average molecular weight of from 2000 to $1 \times 10^5$, and particularly preferably a polymer having a weight average molecular weight of from 5000 to $5 \times 10^4$.

The content of the alkali-soluble resin in the colored curable composition may be suitably selected in the range satisfying the B/C ratio described above. Specifically, from the viewpoint of, for example, developability, the content of the alkali-soluble resin is preferably from 10 to 90 mass %, more preferably from 20 to 80 mass %, and particularly preferably from 30 to 70 mass %, with respect to the total solid content of the composition.

(D) Polymerizable Monomer

The colored curable composition for a color filter of the invention contains at least one polymerizable monomer. Due to the inclusion of the polymerizable compound, the composition can be polymerized and cured in a desired pattern to obtain a cured pattern.

The polymerizable compound is a compound having a polymerizable group, and the polymerizable group is not particularly limited insofar as it is a group that contributes to polymerization. The polymerizable group is preferably a group having an ethylenic unsaturated double bond from the viewpoint of enhancing the effects of the invention. The polymerizable compound may be suitably selected from polymerizable compounds that have an ethylenic unsaturated double bond, and is preferably a polymerizable monomer having a molecular weight of 2000 or less from the viewpoint of obtaining favorable developability and capability of forming a fine pattern. The polymerizable monomer is not particularly limited, and is preferably a compound having a boiling point of 100° C. or more under normal pressure and having at least one ethylenic unsaturated group.

Examples of the "compound having a boiling point of 100° C. or more under normal pressure and having at least one ethylenic unsaturated group" include monofunctional acrylates or methacrylates, such as polyethylene glycol mono(meth)acrylate, polypropylene glycol mono(meth)acrylate, or phenoxyethyl(meth)acrylate; compounds in which an ethylene oxide or a propylene oxide is added to polyfunctional alcohols and then (meth)acrylated, such as polyethylene glycol di(meth)acrylate, trimethylolethane tri(meth)acrylate, neopentyl glycol di(meth)acrylate, pentaerythritol tri(meth)

acrylate, pentaerythritol tetra(meth)acrylate, dipentaerythritol hexa(meth)acrylate, hexanediol (meth)acrylate, trimethylolpropane tri(acryloyloxypropyl)ether, tri(acryloyloxyethyl)isocyanurate, glycerol, or trimethylolethane, and polyfunctional acrylates or methacrylates, such as urethane acrylates described in JP-B Nos. 48-041708 and 50-006034 and JP-A No. 51-037193, polyester acrylates described in each of JP-A No. 48-064183 and JP-B Nos. 49-043191 and 52-030490, and epoxy acrylates as a reaction product of an epoxy resin and (meth)acrylic acid. Examples further include photocurable monomers and oligomers described in Journal of the Adhesion Society of Japan, Vol. 20, No. 7, p.p. 300 to 308.

In particular, a polymerizable monomer having a polar group and at least one ethylenic unsaturated double bond is preferable due to favorable polymerization reaction properties thereof, and a polyfunctional monomer having a polar group and two or more ethylenic unsaturated double bonds are more preferable. Examples of the polar group include a carboxyl group and a hydroxyl group, and examples of preferable polymerizable groups include a (meth)acryloyl group.

Among polyfunctional monomers, a polyfunctional monomer having a polar group and three or more functional groups are preferable, and polymerizable monomers represented by the following Formula (I) or (ii) are more preferable, due to favorable polymerization reaction thereof.

In the specification, the term "(meth)acryloyl" represents either of acryloyl or methacryloyl or both, and the term "(meth)acryl" represents either of acryl or methacryl or both.

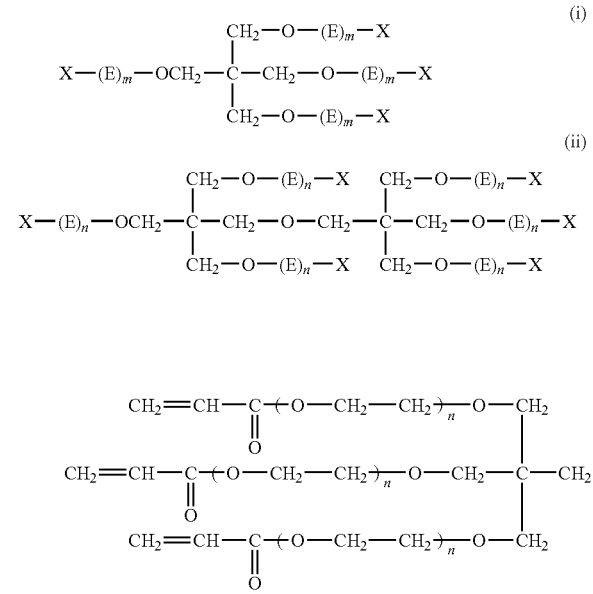

In Formulae (i) and (ii), each E independently represents $-((CH_2)_yCH_2O)-$ or $-((CH_2)_yCH(CH_3)O)-$, and each y independently represents an integer of 1 to 10. Each X independently represents an acryloyl group, a methacryloyl group, a hydrogen atom, or a carboxyl group.

In Formula (i) above, the total number of acryloyl groups and methacryloyl groups is 3 or 4, each m independently represents an integer of 0 to 10, and the total of each m is an integer of 1 to 40. In Formula (ii) above, the total number of acryloyl groups and methacryloyl groups is 5 or 6, each n independently represents an integer of 0 to 10, and the total of each n is an integer of 1 to 60.

In Formula (i) above, m represents preferably an integer of 0 to 6, and more preferably 0 to 4. The total of each m is an integer of preferably 2 to 40, more preferably 2 to 16, and particularly preferably 4 to 8. In Formula (ii) above, n represents an integer of preferably 0 to 6, and more preferably 0 to 4. The total of each n is an integer of preferably 3 to 60, more preferably 3 to 24, and particularly preferably 6 to 12.

In Formula (i) or Formula (ii) above, it is preferable that the oxygen side terminal of $-((CH_2)_yCH_2O)-$ or $-((CH_2)_yCH(CH_3)O)-$ is bonded to X.

The compounds represented by Formula (I) or (ii) above can be synthesized through known processes, specifically the processes of:

bonding ring-opened skeleton of ethylene oxide or a propylene oxide to pentaerythritol or dipentaerythritol by a ring-opening addition reaction; and allowing (meth)acryloyl chloride, for example, to a terminal hydroxyl group of the ring-opened skeleton to introduce a (meth)acryloyl group. Each process is widely known, and the compound represented by Formula (i) or (ii) can be easily synthesized by the processes.

Among the compounds represented by Formula (i) or (ii), preferable examples include a pentaerythritol derivative and/or a dipentaerythritol derivative. Specific examples include the compounds (Exemplified Compounds (a) to (f)) represented by Formulae (a) to (f) shown below and, among the above, Exemplified Compounds (a), (b), (e), and (f) are particularly preferable.

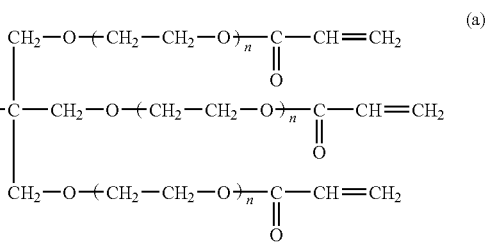

(a)

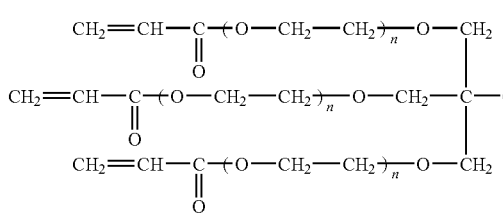

Total of each n is 6

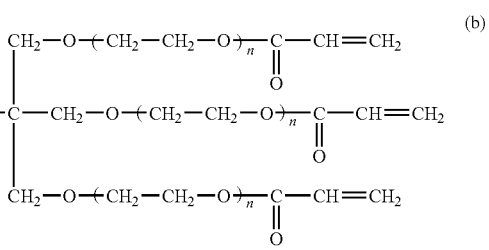

(b)

Total of each n is 12

-continued

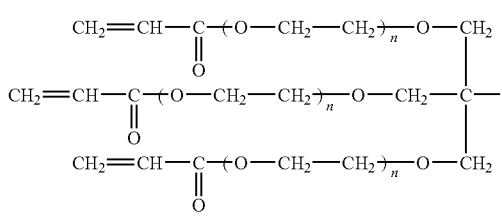 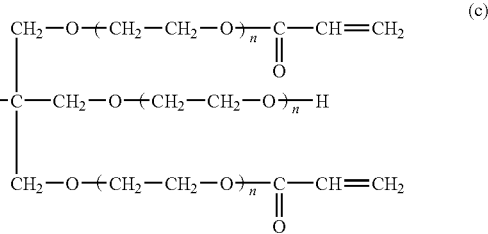

(c)

Total of each n is 12

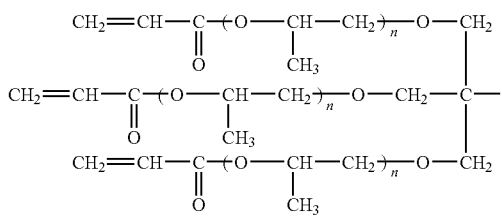 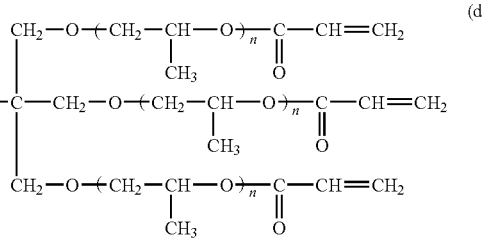

(d)

Total of each n is 6

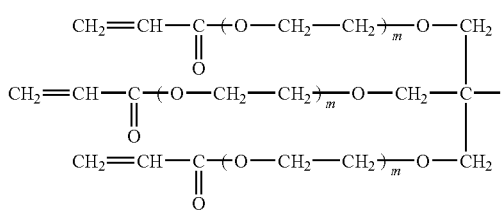 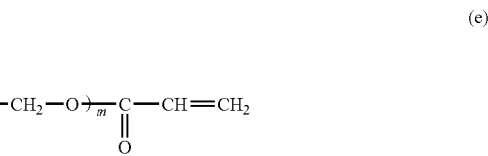

(e)

Total of each m is 4

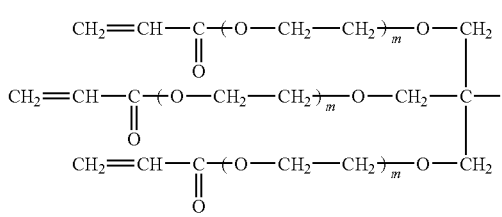 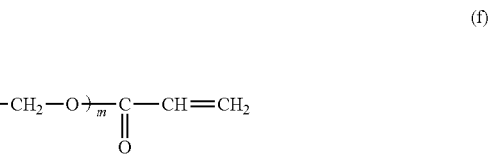

(f)

Total of each m is 12

As the compound represented by Formula (i) or Formula (ii), commercially available products may be used. Examples of the commercially available products include SR-494 (trade name) manufactured by Sartomer Company and DPCA-60 and TPA-330 (trade names) manufactured by Nippon Kayaku Co., Ltd.

The polymerizable compound may be contained at an arbitrary ratio insofar as the colored curable composition of the invention is able to form a film having adhesiveness when exposed to light and the effects of the invention are not impaired. Specifically, the content of the polymerizable compound in the colored curable composition is preferably in the range of from 5 to 50 mass %, more preferably in the range of from 10 to 40 mass %, and particularly preferably in the range of from 20 to 30 mass %, with respect to the total solid content of the colored curable composition, from the viewpoint of forming a pattern having a high resolution and a favorable shape with a composition system that is in the form of a thin film and/or contains a coloring agent at a high content.

(E) Photopolymerization Initiator

The colored curable composition for a color filter of the invention contains at least one photopolymerization initiator. The photopolymerization initiator is not particularly limited insofar as it causes a polymerization reaction of a polymerizable group, and is preferably selected from the viewpoints of, for example, properties, initiation efficiency, absorption wavelength, availability, and cost.

Examples of the photopolymerization initiator include at least one active halogenated compound selected from a halomethyl oxadiazole compound or a halomethyl-s-triazine compound, a 3-aryl-substituted coumarin compound, a lophine dimer, a benzophenone compound, an acetophenone compound and a derivative thereof, a cyclopentadiene-benzene-iron complex and a salt thereof, and an oxime compound. Specific examples of the photopolymerization initiator include substances described in paragraphs [0070] to [0079] of JP-A No. 2004-295116.

The photopolymerization initiator in the invention is preferably an oxime polymerization initiator in view of the rapidness of the polymerization reaction achieved thereby. In particular, when the oxime polymerization initiator is present with the polyfunctional monomer, higher exposure sensitivity is obtained, and an enhancement of the developability of an unexposed portion and a reduction in development residue can be achieved. Moreover, even when the amount of the oxime polymerization initiator is in a range in which the amount of pigment can be increased without reducing the sensitivity, the difference in alkali dissolution rates between an exposed region and an unexposed area (discrimination) can be maintained, and formation of a finer pattern and reproduction of a rectangular shape can be achieved.

The oxime polymerization initiator can be suitably selected from the oxime initiators described in JP-A Nos. 2000-080068 and 2001-233842. Specifically, an oxime ester polymerization initiator can be preferably used.

Preferable examples of the oxime ester polymerization initiator include
2-(O-benzoyloxime)-1-[4-(phenylthio)phenyl]-1,2-butanedione,
2-(O-benzoyloxime)-1-[4-(phenylthio)phenyl]-1,2-pentanedione,
2-(O-benzoyloxime)-1-[4-(phenylthio)phenyl]-1,2-hexanedione,
2-(O-benzoyloxime)-1-[4-(phenylthio)phenyl]-1,2-heptanedione,
2-(O-benzoyloxime)-1-[4-(phenylthio)phenyl]-1,2-octanedione,
2-(O-benzoyloxime)-1-[4-(methylphenylthio)phenyl]-1,2-butanedione,
2-(O-benzoyloxime)-1-[4-(ethylphenylthio)phenyl]-1,2-butanedione,
2-(O-benzoyloxime)-1-[4-(butylphenylthio)phenyl]-1,2-butanedione,
1-(O-acetyloxime)-1-[9-ethyl-6-(2-methylbenzoyl)-9H-carbazole-3-yl]ethanone,
1-(O-acetyloxime)-1-[9-methyl-6-(2-methylbenzoyl)-9H-carbazole-3-yl]ethanone,
1-(O-acetyloxime)-1-[9-propyl-6-(2-methylbenzoyl)-9H-carbazole-3-yl]ethanone,
1-(O-acetyloxime)-1-[9-ethyl-6-(2-ethylbenzoyl)-9H-carbazole-3-yl]ethanone,
1-(O-acetyloxime)-1-[9-ethyl-6-(2-butylbenzoyl)-9H-carbazole-3-yl]ethanone,
1-phenyl-1,2-propanedione-2-(o-ethoxycarbonyl)oxime, and
O-benzoyl-4'-(benzmercapto)benzoyl-hexyl-ketoxime.

Among the above photopolymerization initiators, oxime ester polymerization initiators are preferable, and 2-(O-benzoyloxime)-1-[4-(phenylthio)phenyl]-1,2-octanedione and 1-(O-acetyloxime)-1-[9-ethyl-6-(2-methylbenzoyl)-9H-carbazole 3-yl]ethanone are most preferable.

The molar extinction coefficient of the oxime polymerization initiator at 365 nm or 405 nm is preferably from 10000 to 300000, more preferably from 15000 to 300000, and particularly preferably from 20000 to 200000, from the viewpoint of sensitivity. The molar extinction coefficient is measured at a concentration of 0.01 g/L using an ethyl acetate solvent by an UV-visible light spectrophotometer (CARY-5 SPECTROPHOTOMETER, trade name, manufactured by Varian).

The content of the photopolymerization initiator in the colored curable composition is preferably from 2 to 50 mass %, and more preferably from 30 to 50 mass %, relative to polyfunctional (meth)acrylate monomer. When the content of the photopolymerization initiator is 2 mass % or more, high exposure sensitivity is obtained. A content of the photopolymerization initiator of 50 mass % or less is advantageous in suppressing an increase in line width that occurs depending on the exposure amount. The photopolymerization initiator may be used singly or in combination of two or more thereof.

(F) Organic Solvent

In general, the colored curable composition for a color filter of the invention may include an organic solvent. The organic solvent is not particularly limited insofar as it provides required solubility of each component and sufficient coatability of the colored curable composition, and is preferably selected considering, particularly, the solubility of UV absorbers and binders, coatability, and safety. Moreover, when the colored curable composition in the invention is prepared, the colored curable composition preferably includes at least two organic solvents.

Preferable examples of organic solvents include esters, such as ethyl acetate, n-butyl acetate, isobutyl acetate, amyl formate, isoamyl acetate, isobutyl acetate, butyl propionate, isopropyl butyrate, ethyl butylate, butyl butyrate, methyl lactate, ethyl lactate, alkyl oxyacetates (e.g., methyl oxyacetates, ethyl oxyacetates, butyl oxyacetates, (e.g., methyl methoxyacetate, ethyl methoxyacetate, butyl methoxyacetate, methyl ethoxyacetate, and ethyl ethoxyacetate), alkyl 3-oxypropionates (e.g., methyl 3-oxypropionates and ethyl 3-oxypropionates (e.g., methyl 3-methoxypropionate, ethyl 3-methoxypropionate, methyl 3-ethoxypropionate, and ethyl 3-ethoxypropionate)), alkyl 2-oxypropionates (e.g., methyl 2-oxypropionates, ethyl 2-oxypropionates, and propyl 2-oxypropionates (e.g., methyl 2-methoxypropionate, ethyl 2-methoxypropionate, propyl 2-methoxypropionate, methyl 2-ethoxypropionate, and ethyl 2-ethoxypropionate)), methyl 2-oxy-2-methylpropionates, ethyl 2-oxy-2-methylpropionates (e.g., methyl 2-methoxy-2-methylpropionate and ethyl 2-ethoxy-2-methylpropionate), methyl pyruvate, ethyl pyruvate, propyl pyruvate, methyl acetoacetate, ethyl acetoacetate, methyl 2-oxobutanoate, or ethyl 2-oxobutanoate, ethers, such as diethylene glycol dimethyl ether, tetrahydrofuran, ethylene glycol monomethyl ether, ethylene glycol monoethyl ether, methyl cellosolve acetate, ethyl cellosolve acetate, diethylene glycol dimethyl ether, diethylene glycol monoethyl ether, diethylene glycol monobutyl ether, propylene glycol monomethyl ether, propylene glycol monomethyl ether acetate, propylene glycol monoethyl ether acetate, or propylene glycol monopropylether acetate, ketones, such as methyl ethyl ketone, cyclohexanone, 2-heptanone, or 3-heptanone, and aromatic hydrocarbons, such as toluene or xylene.

It is also preferable to use a mixture of two or more of these organic solvents, from the viewpoint of improving the solubility of the UV absorber and the alkali-soluble resin and the coating surface state. When a mixture of two or more solvents is used, the mixture is preferably a mixed solution composed by two or more selected from methyl 3-ethoxypropionate, ethyl 3-ethoxypropionate, ethylcellosolve acetate, ethyl lactate, diethylene glycol dimethyl ether, butyl acetate, methyl 3-methoxypropionate, 2-heptanone, cyclohexanone, ethylcarbitol acetate, butylcarbitol acetate, propylene glycol methyl ether, and propylene glycol methyl ether acetate mentioned above.

The content of the organic solvent in the colored curable composition is adjusted such that the total solid content of the composition is preferably from 5 to 80 mass %, more preferably from 5 to 60 mass %, and particularly preferably from 10 to 50 mass %, from the viewpoint of coatability.

(G) Surfactant

Various surfactants may be incorporated into the colored curable composition for a color filter according to the invention, with a view to further improving the coatability. Examples of surfactants that may be used include a fluorosurfactant, a nonionic surfactant, a cationic surfactant, an anionic surfactant, and a silicone surfactant.

In particular, the incorporation of a fluorosurfactant further improves the liquid properties (particularly, fluidity) of a coating liquid formed from the colored curable composition, and further improves the uniformity of the coating thickness and/or liquid saving properties. Specifically, a colored photosensitive composition containing a fluorosurfactant exhibits an improved wettability on a surface to be coated, by decreasing the interfacial tension between the surface to be coated and the coating liquid, thereby enhancing the coatability on the surface to be coated. Therefore, the incorporation of a fluorosurfactant is effective in that a film having a substantially uniform thickness and a reduced thickness variation can be formed even when the film is formed from the coating liquid in a small amount so as to be a thin film that is as thin as a few micrometers.

The fluorine content in the fluorosurfactant is preferably from 3% by mass to 40% by mass, more preferably from 5% by mass to 30% by mass, and particularly preferably from 7% by mass to 25% by mass. A fluorine content within the above range is effective in the uniformity of the coating thickness and liquid saving, and provides a favorable solubility in the composition.

Examples of fluorosurfactants include: MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F479, MEGAFACE F482, MEGAFACE F780, and MEGAFACE F781 (tradenames, manufactured by DIC Corporation); FLUORAD FC430, FLUORAD FC431, and FLUORAD FC171 (tradenames, manufactured by Sumitomo 3M Limited); SURFLON S-382, SURFLON SC-101, SURFLON SC-103, SURFLON SC-104, SURFLON SC-105, SURFLON SC1068, SURFLON SC-381, SURFLON SC-383, SURFLON S393, and SURFLON KH-40 (tradenames, manufactured by Asahi Glass Co., Ltd.); and CW-1 (tradename, manufactured by Zeneca Ltd.).

Examples of silicone surfactants include: TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (tradenames, manufactured by Toray Silicone Company, Ltd.); TSF-4440, TSF-4300, TSF-4445, TSF-444(4)(5)(6)(7)6, TSF-4460, and TSF-4452 (tradenames, manufactured by Momentive Performance Materials Inc.); KP341 (tradename, manufactured by Shin-Etsu Chemicals Co., Ltd.); and BYK323 and BYK330 (tradenames, manufactured by BYK-Chemie).

Examples of cationic surfactants include: phthalocyanine derivatives (an example of commercially available product thereof is EFKA-745 available from Morishita & Co., Ltd.); organosiloxane polymer KP341 (tradename, manufactured by Shin-Etsu Chemicals Co., Ltd.); (meth)acrylic (co)polymer POLYFLOW No. 75, No. 90, and No. 95 (tradenames, manufactured by KYOEISHA CHEMICAL Co., Ltd.); and W001 (tradename, available from Yusho Co., Ltd.).

Examples of nonionic surfactants include polyoxyethylene lauryl ether, polyoxyethylene stearyl ether, polyoxyethylene oleyl ether, polyoxyethylene octyl phenyl ether, polyoxyethylene nonyl phenyl ether, polyethyleneglycol dilaurate, polyethyleneglycol distearate, and sorbitan fatty acid esters (such as PLURONIC L10, L31, L61, L62, 10R5, 17R2, and 25R2 and TETRONIC 304, 701, 704, 901, 904, and 150R1 (tradenames, manufactured by BASF)).

Examples of anionic surfactants include W004, W005, and W017 (tradenames, available from Yusho Co., Ltd.).

(H) Polymerization Inhibitor

It is preferable to add a small amount of polymerization inhibitor to the colored curable composition for a color filter according to the invention, with a view to preventing unnecessary thermal polymerization of a polymerizable compound during the production or storage of the colored curable composition. Examples of polymerization inhibitors include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and cerous salt of N-nitrosophenylhydroxyamine.

The amount of the polymerization inhibitor to be added is preferably from about 0.01% by mass to about 5% by mass relative to the mass of the entire composition.

(I) Other Components

The colored curable composition for a color filter of the invention may also contain other components, such as other additives, in addition to the components mentioned above.

In the colored curable composition in the invention, various additives, such as fillers, high molecular weight compounds other than those mentioned above, adhesion accelerators, antioxidants, or agglomeration inhibitors, can be blended, as required. Specific examples of the additives include fillers, such as glass or alumina; high molecular weight compounds other than binding resins, such as polyvinyl alcohol, polyacrylic acid, polyethylene glycol monoalkyl ether, or polyfluoroalkyl acrylate; adhesion accelerators, such as vinyltrimethoxysilane, vinyltriethoxysilane, vinyl tris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, or 3-mercaptopropyltrimethoxysilane; antioxidants, such as 2,2-thiobis(4-methyl-6-t-butylphenol) or 2,6-di-t-butylphenol, and agglomeration inhibitors, such as sodium polyacrylate.

In order to accelerate the alkali solubility of the colored curable composition in a region which has not been irradiated with ultraviolet ray and further enhance the developability, the colored curable composition in the invention may include an organic carboxylic acid, preferably an organic carboxylic acid having a low molecular weight of 1000 or less.

Specific examples of the organic carboxylic acid include aliphatic monocarboxylic acids, such as formic acid, acetic acid, propionic acid, butyric acid, valeric acid, pivalic acid, caproic acid, diethylacetic acid, enanthic acid, or caprylic acid; aliphatic dicarboxylic acids, such oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethyl succinic acid, or citraconic acid; aliphatic tricarboxylic acids, such as tricarballylic acid, aconitic acid, or camphoronic acid; aromatic monocarboxylic acids, such as benzoic acid, toluic acid, cuminic acid, hemellitic acid, or mesitylenic acid; aromatic polycarboxylic acids, such as phthalic acid, isophthalic acid, terephthalic acid, trimellitic acid, trimesic acid, mellophanic acid, or pyromellitic acid; and other carboxylic acids, such as phenylacetic acid, hydratropic acid, hydrocinnamic acid, mandelic acid, phenylsuccinic acid, atropic acid, cinnamic acid, methyl cinnamate, benzyl cinnamate, cinnamylidene acetic acid, coumaric acid, or umbellic acid.

<Color Filter and Method for Producing the Same>

Next, the color filter of the invention will be described in detail with reference to a method for producing the same.

The color filter of the invention is produced using the colored curable composition for a color filter of the invention described above, and a method for producing the same is not particularly limited insofar as the colored curable composition of the invention is used. Preferably, the color filter of the invention is produced by a method (method for producing a color filter of the invention) including a process of forming a colored pattern (hereinafter also referred to as a "pattern formation process") by applying the colored curable composition of the invention preciously described above onto a support, patternwise exposing the resultant coating film to light (preferably through a mask), and developing the coating film.

In the color filter of the invention and a method for producing the same, the colored curable composition for a color filter of the invention described above is used. The use of the colored curable composition for a color filter of the invention allows the production of a color filter having a colored pattern with a desired color density and hue (specifically, for example, a colored pattern having a thickness of 1 μm or less) and having a high resolution and a favorable pattern shape (rectangular properties of a pattern particularly in the case of a solid state imaging device). Moreover, the method is also effective for producing a color filter in which the adhesiveness to the support is favorable and the occurrence of image defects, such as separation, is suppressed.

In the pattern formation process in the invention, the color filter can be produced by, for example, applying the colored curable composition onto a support by a coating method, such as spin coating, casting, or roll coating, to form a radiation sensitive composition layer, exposing the formed layer to light through a given mask pattern, and developing the composition layer with a developer to form a negative colored pattern. Moreover, the production process may further include a curing process of curing the formed colored pattern by heating and/or light exposing, as required.

In the production of the color filter, when the pattern formation process (and, optionally, the curing process) is repeated according to the desired number of colors, thereby producing a color filter having the desired colors. The light or radiation to be used for exposure is preferably a ultraviolet light, such as g line, h line, or i line.

The exposure may be carried out by any of a proximity method, a mirror projection method, or a stepper method, and it is preferable to perform the exposure by a stepper method (reduced projection exposure using a reduced projection exposure device). The stepper method is a method of forming a pattern by carrying out light exposure while changing the exposure amount stepwise. When the stepper exposure is performed, the rectangular properties of a pattern, in particular, can be improved.

Examples of an exposure device to be used in the stepper exposure include an i line stepper (trade name: FPA-3000i5+, manufactured by Canon Inc.).

Examples of the support include soda glass, PYREX (registered trademark) glass, and quartz glass for use in liquid crystal display devices, and supports each obtained by attaching a transparent conductive film to any of these materials; photoelectric conversion substrates for use in imaging devices, such as a silicon substrate; and complementary metal oxide semiconductors (CMOS). These substrates may have black stripes that separate the respective pixels.

On the supports, an undercoat layer may be provided, if necessary, for the purpose of improving the adhesion with an upper layer, preventing diffusion of substances, or flattening the substrate surface.

The developer may be any developer having a composition that dissolves the intact colored curable composition of the invention (the colored curable composition in an uncured portion) but does not dissolve a cured portion which has been irradiated. Specifically, combinations of various organic solvents and aqueous alkaline solutions can be used. Examples of organic solvents include the above-described organic solvents that can be used for preparing the colored curable composition of the invention.

Preferable examples of the aqueous alkaline solution include an aqueous alkaline solution in which an alkaline compound is dissolved at a concentration of from 0.001 to 10 mass %, and preferably from 0.01 to 1 mass %. Examples of the alkaline compound include sodium hydroxide, potassium hydroxide, sodium carbonate, sodium silicate, sodium metasilicate, ammonia water, ethylamine, diethylamine, dimethylethanolamine, tetramethylammonium hydroxide, tetraethylammonium hydroxide, choline, pyrrole, piperidine, and 1,8-diazabicyclo-[5.4.0]-7-undecene When a developer containing such an aqueous alkaline solution is used, washing with water is generally performed after development.

The color filter of the invention can be used for liquid crystal display devices and solid state imaging devices, such as CCD, and is preferable particularly for CCD elements and CMOS having a resolution as high as exceeding 1 million pixels. The color filter of the invention can be used as, for example, a color filter disposed between a light-gathering microlens and the light receiving portions of the pixel constituting CCD.

<Solid State Imaging Device>

The solid state imaging device of the invention is provided with a color filter for which the colored curable composition for a color filter of the invention is used and which has a pattern excellent in rectangular properties or the shape such as line width. The solid state imaging device of the invention is provided with the color filter of the invention described above, and thus has superior color reproduction properties.

The configuration of the solid state imaging device is not particularly limited insofar as it has the color filter of the invention and functions as a solid state imaging device. Examples of the configuration include the following.

In one configuration, the solid state imaging device includes:

plural photodiodes constituting light receiving areas of a CCD image sensor (solid state imaging device) and transfer electrodes made of polysilicon or the like provided on a support;

a light-shielding film made of tungsten or the like provided on the photodiodes and the transfer electrodes such that only light receiving portions of the photodiodes are uncovered;

a device protection film made of silicon nitride or the like provided on the light-shielding film so as to cover the entire surface of the light-shielding film and the light receiving portions of the photodiodes; and the color filter of the invention provided on the device protection film.

Furthermore, a light gathering member (e.g., microlens, the same applies in the following description) may be provided on the device protection layer such that the light gathering member is positioned under the color filter (i.e., positioned at the side of the color filter that is nearer to the support). Alternatively, the light receiving member may be provided on the color filter.

Hereinafter, exemplifying aspects and embodiments of the invention will be described.

<1> A colored curable composition for a color filter comprising:

(A) a pigment in a amount of from 35 to 70 mass % with respect to the total solid content of the colored curable composition, (B) an amino resin,
(C) an alkali-soluble resin,
(D) a polymerizable monomer, and
(E) a photopolymerization initiator,
the ratio of (B) the amino resin to (C) the alkali-soluble resin (B/C; mass ratio) being in the range of from 1 to 10.

<2> The colored curable composition for a color filter according to <1>, wherein (B) the amino resin has (i) a main chain portion having a nitrogen atom, (ii) a group X having a functional group having a pKa of 14 or less and being bonded to the nitrogen atom present in the main chain portion, and (iii) an oligomer or polymer chain Y that is present at a side chain of the main chain portion and has a number average molecular weight of from 500 to 1,000,000.

<3> The colored curable composition for a color filter according to <2>, wherein (i) the main chain portion having a nitrogen atom comprises an oligomer or a polymer having an amino group.

<4> The colored curable composition for a color filter according to <2> or <3>, wherein (i) the main chain portion having a nitrogen atom comprises at least one of poly(lower alkylene imine), polyallylamine, polydiallylamine, a metaxylenediamine-epichlorohydrin polycondensate, polyvinylamine, a 3-dialkyl aminopropyl(meth)acrylic acid amide copolymer, or a 2-dialkylaminoethyl(meth)acrylate copolymer.

<5> The colored curable composition for a color filter according to any one of <2> to <4>, wherein the functional group having a pKa of 14 or less comprises at least one of a carboxylic acid group, a sulfonic acid group, or —COCH$_2$CO—.

<6> The colored curable composition for a color filter according to any one of <2> to <5>, wherein the group X having a functional group having a pKa of 14 or less comprises at least one group having a structure represented by Formula (V-1), Formula (V-2), or Formula (V-3),

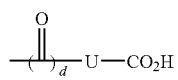

Formula (V-1)

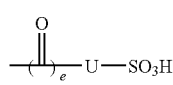

Formula (V-2)

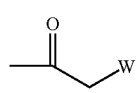

Formula (V-3)

wherein in Formula (V-1) and Formula (V-2), U represents a single bond or a divalent linking group and d and e each independently represent 0 or 1, and, in Formula (V-3), W represents an acyl group or an alkoxycarbonyl group.

<7> The colored curable composition for a color filter according to any one of <1> to <6>, wherein (B) the amino resin comprises a repeating unit represented by Formula (I-1) and a repeating unit represented by Formula (I-2),

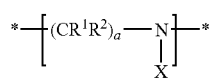

Formula (I-1)

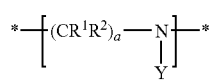

Formula (I-2)

wherein, in Formulae (I-1) and (1-2), $R^1$ and $R^2$ each independently represent a hydrogen atom, a halogen atom, or an alkyl group; a represents an integer of 1 to 5; * represents a linking portion of each repeating unit; X represents a group having a functional group having a pKa of 14 or less, and Y represents an oligomer or polymer chain having a number average molecular weight of from 500 to 1,000,000.

<8> The colored curable composition for a color filter according to <7>, wherein (B) the amino resin further comprises a repeating unit represented by Formula (I-3),

Formula (I-3)

wherein, in Formula (I-3), $R^1$ and $R^2$ each independently represent a hydrogen atom, a halogen atom, or an alkyl group; a represents an integer of 1 to 5; * represents a linking portion of each repeating unit, and Y' represents an oligomer or polymer chain having an anionic group and having a number average molecular weight of from 500 to 1,000,000.

<9> The colored curable composition for a color filter according to any one of <1> to <8>, wherein (B) the amino resin comprises a repeating unit represented by Formula (II-1) and a repeating unit represented by Formula (II-2),

Formula (II-1)

Formula (II-2)

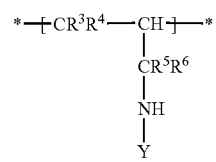

wherein, in Formulae (II-1) and (II-2), $R^3$, $R^4$, $R^5$, and $R^6$ each independently represent a hydrogen atom, a halogen atom, or an alkyl group; * represents a linking portion of each repeating unit; X represents a group having a functional group having a pKa of 14 or less, and Y represents an oligomer or polymer chain having a number average molecular weight of from 500 to 1,000,000.

<10> The colored curable composition for a color filter according to <9>, wherein (B) the amino resin further contains a repeating unit represented by Formula (II-3),

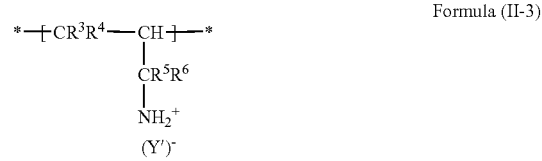

Formula (II-3)

wherein, in Formula (II-3), $R^3$, $R^4$, $R^5$, and $R^6$ each independently represent a hydrogen atom, a halogen atom, or an alkyl group; * represents a linking portion of each repeating unit; and Y' represents an oligomer or polymer chain having an anionic group and having a number average molecular weight of from 500 to 1,000,000.

<11> The colored curable composition for a color filter according to any one of <2> to <10>, wherein the oligomer or polymer chain Y having a number average molecular weight of from 500 to 1,000,000 is at least one oligomer or polymer chain selected from polyester, polyamide, polyimide, and poly(meth)acrylic ester.

<12> The colored curable composition for a color filter according to any one of <1> to <11>, wherein the ratio of the total amount of (B) the amino resin and (C) the alkali-soluble resin to (A) the pigment ((B+C)/A; mass ratio) is in the range of from 0.3 to 0.5.

<13> A color filter, comprising a colored pattern formed on a support using the colored curable composition for a color filter according to any one of <1> to <12>.

<14> A method for producing a color filter, comprising:
applying the colored curable composition for a color filter according to any one of <1> to <12> onto a support, and
pattern exposing and developing a coating layer formed by applying the colored curable composition to form a colored pattern.

<15> A solid state imaging device, comprising the color filter according to <13>.

EXAMPLES

The invention is more specifically described below with reference to Examples. However, the invention is not limited to the following Examples, and other embodiments are also included in the scope of the invention unless the gist of the invention is maintained. Unless otherwise specified, "part(s)" is based on mass.

Example 1

Production of Wafer Having Planarization Film (1) Preparation of Resist Liquid for Planarization Film
Components of the following composition were mixed, and the mixture was stirred with a stirrer to prepare a resist liquid for a planarization film.

| <Composition of resist liquid for planarization film> | |
| --- | --- |
| Benzyl methacrylate/Methacrylic acid copolymer (=70/30 [molar ratio], Weight average molecular weight: 30000) | 16.4 parts |
| Dipentaerythritol pentaacrylate | 6.5 parts |
| Propylene glycol monomethyl ethyl acetate | 13.8 parts |
| Ethyl-3-ethoxypropionate | 12.3 parts |
| Triazine initiator shown below | 0.3 parts |

Triazine Initiator

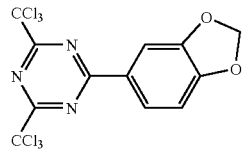

(2) Formation of Planarization Film
A 6-inch silicon wafer was prepared, the resist liquid for a planarization film obtained above was uniformly applied to the wafer by spin coating to form a coating film, and then the formed coating film was heated on a hot plate having a surface temperature of 120° C. for 120 seconds. Here, the spin coating was performed at an adjusted rotation number for coating so that the film thickness of the coating film after heating was about 1 μm. Subsequently, the coating film after heating was further heated in a 220° C. oven for 1 hour to cure the coating film, thereby obtaining a planarization film.

As a result, a wafer having a planarization film, in which the planarization film was formed on the 6-inch silicon wafer, was obtained.

Preparation of Color Resist Liquid (Colored Curable Composition)

(1) Preparation of Pigment Dispersion Liquid
490 parts of propylene glycol monomethyl ether acetate (PGMEA) was added to 55 parts of C.I. Pigment Green 36 (PG36), 45 parts of C.I. Pigment Yellow 150 (PY150), and 25 parts of the following dispersion resin (I) to give a mixed liquid in an amount of 625 parts. The mixed liquid was mixed and dispersed with a bead mill (using 0.3 mm zirconia beads) for 3 hours, whereby a pigment dispersion liquid was prepared.
—Synthesis of Dispersion Resin (I)—
<1. Synthesis of Polyester (i)>
5.1 g of n-octanoic acid, 200 g of ε-caprolactone, and 5 g of titanium (IV) tetrabutoxide were mixed, heated at 160° C. for 8 hours, and then cooled to room temperature, whereby a polyester (i) (having a weight average molecular weight of 18000 and a number average molecular weight of 14000) was obtained. The scheme is shown below.

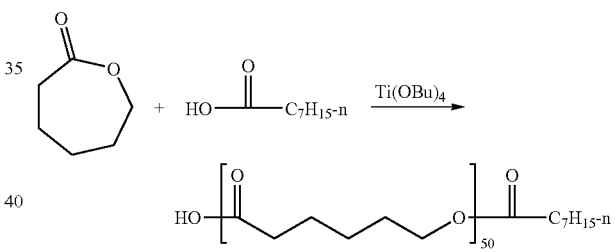

<2. Synthesis of Dispersion Resin (I)>
15 g of polyethyleneimine (SP-012 (trade name), manufactured by NIPPON SHOKUBAI CO., LTD., number average molecular weight: 1200) and 100 g of the polyester (i) were mixed, and the resultant mixture was heated at 120° C. for 3 hours, whereby an intermediate was obtained. Thereafter, the intermediate was allowed to cool to 65° C., and 200 g of propylene glycol 1-monomethyl ether 2-acetate (PGMEA) containing 0.5 g of succinic anhydride was slowly added thereto and stirred for 2 hours. Thereafter, PGMEA was added to provide a 10 mass % PGMEA solution of a dispersion resin (I). The dispersion resin (I) has a side chain derived from the polyester (i) and also has a group having a functional group (carboxyl group) derived from succinic anhydride and having a pKa of 14 or less. The weight average molecular weight of the dispersion resin (I) was 18000.

(2) Preparation of Color Resist Liquid (Colored Curable Composition)
Using the pigment dispersion liquid, various components were mixed and stirred so as to achieve the following composition ratio, thereby preparing a color resist liquid (colored curable composition). The solid content of the color resist liquid is 20 mass % and the amount of pigment relative to the total solid content of the color resist is 50 mass %.

| <Composition> | |
|---|---|
| Pigment dispersion liquid above | 62.5 parts |
| Compound II shown below (photopolymerization initiator) (IRGACURE OXE01 (trade name) [2-(o-benzoyloxime)-1-[4-(phenylthio)phenyl]-1,2-octanedione], manufactured by Ciba Specialty Chemicals) | 1.2 parts |
| Dipentaerythritol pentaacrylate (KAYARAD DPHA (trade name), manufactured by Nippon Kayaku Co., Ltd.; polymerizable monomer) | 3.79 parts |
| Alkali-soluble resin (benzyl methacrylate/ methacrylic acid/2-hydroxyethyl methacrylate copolymer (=60/22/18 [molar ratio]) having a weight average molecular weight of 15,000 and a number average molecular weight of 8,000) | 2.5 parts |
| F-475 (trade name, manufactured by DIC Corporation; fluorochemical surfactant) | 0.01 parts |
| o-methoxyphenol (polymerization inhibitor) | 0.002 parts |
| Propylene glycol monomethyl ether acetate (PGMEA; solvent) | 30.0 parts |

Compound II

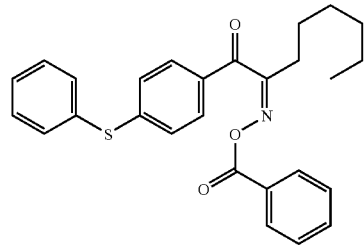 [SMILES: CCCCCC/C(=N/OC(=O)c1ccccc1)C(=O)c1ccc(Sc2ccccc2)cc1]

Production of Color Filter

Onto the planarization film of the wafer with a planarization film, the color resist liquid obtained above was uniformly applied by spin coating to form a coating film, and the formed coating film was heated (prebaked) for 120 seconds on a hot plate having a surface temperature of 100° C., thereby forming a color resist layer. Here, the rotation number for coating during the spin coating was adjusted so that the film thickness of the coating film after the heat treatment was about 0.6 μm. Next, the color resist layer was patternwise exposed through a photomask using an i line stepper (FPA-3000i5+, (trade name), manufactured by Canon). The pattern exposure was performed to a pattern composed of a total of 399 cells which are arranged in matrix of 21 rows×19 columns. In the 21 rows of the matrix, the exposure amount was increased every row by an increment of 250 J/m² starting from the lowest exposure amount of 500 J/m². In the 19 columns, the deviation from the focal distance was varied at an interval of 0.1 μm, centered at the focal distance (Focus 0.0 μm). More specifically, the center column was at the focal distance, and the deviation from the focal distance was varied every column. The photomask used was a photomask by which an image of a pattern composed of 1.4 μm-square pixels arranged in a region of 4 mm×3 mm was formed.

The color resist layer after the pattern exposure was subjected to paddle development at room temperature for 60 seconds using an organic alkaline developer CD-2060 (trade name, manufactured by Fuji Photo Film Electronics Materials). After development, the color resist layer was rinsed with pure water for 20 seconds by spin shower, and further washed with pure water. Thereafter, water droplets were blown away with high pressure air, and the resultant was allowed to naturally dry, as a result of which a colored pattern was formed on the wafer and a green color filter was obtained.

Evaluation

The obtained color resist liquid and color filter were subjected to the following evaluation. The evaluation results are shown in Table 1.

—1. Dispersion Stability—

The obtained color resist liquid was stored at room temperature for seven days, the viscosities before and after the storage were each measured at 25° C. using an E type viscometer (manufactured by Tokyo Keiki Co., Ltd.), and the change Δρ in viscosity between before storage and after storage (=viscosity $\rho^2$ after storage–initial viscosity $\rho^1$ before storage) was determined and used as an index for evaluating the dispersion stability.

Evaluation Criteria

A: Δρ<0.5 mPa·s

B: 0.5 mPa·s≦Δρ<1.0 mPa·s

C: 1.0 mPa·s≦Δρ<3.0 mPa·s

D: 3.0 mPa·s≦Δρ10.0 mPa·s

E: Δρ>10.0 mPa·s

—2. Resolution—

The colored pattern formed on the wafer was measured using a length measurement SEM (S-9260 (scanning electron microscope), trade name, manufactured by Hitachi, Ltd.), and the dimensions of the colored pattern in an exposed portion and the degree of residues in an unexposed portion that had not been removed by development were evaluated based on the SEM image. It is preferable that there is a difference in developer solubility between the exposed portion and the unexposed portion, that the image formed by the exposed portion has a dimension corresponding to the mask design, and that there is no dissolution residues in the unexposed portion.

Judgment Criteria

A: In the exposed portion, the image was formed in a 1:1 size relative to the mask size, there were no dissolution residues in the unexposed portion, and the pattern shape was a favorable rectangular shape.

B: In the exposed portion, the image was formed in a 1:1 size relative to the mask size, and the dissolution residues were not observed in the unexposed portion.

C: In the exposed portion, although a pattern was formed, the pattern formed was not in a 1:1 size relative to the mask size, or a development defect was observed in the unexposed portion.

D: The unexposed portion hardly dissolved, and the exposed portion was not formed in a 1:1 size relative to the mask size.

Examples 2 to 8 and Comparative Examples 1 to 4

Color resist liquids were prepared, color filters were produced, and evaluation was performed in the same manner as in Example 1, except changing the amount of each component, the dispersant type, the B/C ratio, and the (B+C)/A ratio as shown in Table 1. The evaluation results are shown in Table 1.

TABLE 1

| | B/C (*1) | (B + C)/A (*2) | Photopolymerization initiator OXE01 (parts) | Pigment dispersion liquid Amount (parts) | Dispersant type | PG36 (parts) | PY150 (parts) | Alkali-soluble resin (parts) | Polymerizable monomer DPHA (parts) |
|---|---|---|---|---|---|---|---|---|---|
| Ex. 1 | 1.0 | 0.5 | 1.2 | 62.5 | Dispersion resin (I) | 55.00 | 45.00 | 2.5 | 3.79 |
| Ex. 2 | 1.5 | 0.5 | 1.2 | 62.5 | Dispersion resin (I) | 55.00 | 45.00 | 2.0 | 3.79 |
| Ex. 3 | 2.33 | 0.5 | 1.2 | 62.5 | Dispersion resin (I) | 55.00 | 45.00 | 1.5 | 3.79 |
| Ex. 4 | 4.0 | 0.5 | 1.2 | 62.5 | Dispersion resin (I) | 55.00 | 45.00 | 1.0 | 3.79 |
| Ex. 5 | 9.0 | 0.5 | 1.2 | 62.5 | Dispersion resin (1) | 55.00 | 45.00 | 0.5 | 3.79 |
| Ex. 6 | 1.5 | 0.5 | 1.2 | 62.5 | Dispersion resin (II) | 55.00 | 45.00 | 2.0 | 3.79 |
| Ex. 7 | 1.5 | 0.5 | 1.2 | 62.5 | Dispersion resin (III) | 55.00 | 45.00 | 2.0 | 3.79 |
| Ex. 8 | 1.5 | 0.5 | 1.2 | 62.5 | Dispersion resin (IV) | 55.00 | 45.00 | 2.0 | 3.79 |
| Comp. Ex. 1 | 1.5 | 0.5 | 1.2 | 62.5 | Dispersant A | 55.00 | 45.00 | 2.0 | 3.79 |
| Comp. Ex. 2 | 1.5 | 0.5 | 1.2 | 62.5 | Dispersant B | 55.00 | 45.00 | 2.0 | 3.79 |
| Comp. Ex. 3 | 0.67 | 0.5 | 1.2 | 62.5 | Dispersion resin (I) | 55.00 | 45.00 | 3.0 | 3.79 |
| Comp. Ex. 4 | 19.0 | 0.5 | 1.2 | 62.5 | Dispersion resin (I) | 55.00 | 45.00 | 0.25 | 3.79 |

| | Polymerization inhibitor (parts) | Surfactant F-475 (parts) | Solvent (parts) | Dispersion stability Initial viscosity ($\rho^1$) | Viscosity after storage ($\rho^2$) | Evaluation | Resolution evaluation |
|---|---|---|---|---|---|---|---|
| Ex. 1 | 0.002 | 0.01 | 30.00 | 4.7 | 5.4 | B | A |
| Ex. 2 | 0.002 | 0.01 | 30.50 | 4.5 | 4.8 | A | A |
| Ex. 3 | 0.002 | 0.01 | 31.00 | 4.3 | 4.7 | A | A |
| Ex. 4 | 0.002 | 0.01 | 31.50 | 4.9 | 5.3 | A | B |
| Ex. 5 | 0.002 | 0.01 | 32.00 | 4.4 | 4.6 | A | B |
| Ex. 6 | 0.002 | 0.01 | 30.50 | 4.6 | 4.7 | A | A |
| Ex. 7 | 0.002 | 0.01 | 30.50 | 4.5 | 4.6 | A | A |
| Ex. 8 | 0.002 | 0.01 | 30.50 | 4.6 | 5.2 | B | A |
| Comp. Ex. 1 | 0.002 | 0.01 | 30.50 | 9.4 | 18.5 | D | D |
| Comp. Ex. 2 | 0.002 | 0.01 | 30.50 | 31.2 | 102.0 | E | D |
| Comp. Ex. 3 | 0.002 | 0.01 | 29.50 | 7.0 | 26.7 | D | B |
| Comp. Ex. 4 | 0.002 | 0.01 | 32.25 | 4.6 | 4.7 | A | D |

*Solid content of color resist liquid = 20 mass %, Pigment amount relative to the total solid content of color resist = 50 mass %
(*1): (B) Amino resin/(C) Alkali-soluble resin [mass ratio]
(*2): [(B) Amino resin + (C) Alkali-soluble resin]/(A) Pigment [mass ratio]

The details of the components in Table 1 are as follows.

Dispersant A: DISPERBYK-170 (trade name, manufactured by BYK Chemie Japan)

Dispersant B: SOLSPERSE 24000GR (trade name, manufactured by Avecia)

Dispersion resins (II) to (IV)

The dispersion resins (II) to (IV) were synthesized in the same manner as the synthesis of the dispersion resin (I), except replacing the 15 g of polyethyleneimine (SP-012, trade name) by 10 g of polyethyleneimine (SP-006, trade name, number average molecular weight: 600, manufactured by NIPPON SHOKUBAI CO., LTD.) as shown in Table 2 and changing the amount of the succinic anhydride as shown in Table 2.

TABLE 2

| | Amino-group-containing resin | Polyester | Precursor of X |
|---|---|---|---|
| Dispersion resin (I) | SP-012 (15 g) | Polyester (i) | Succinic anhydride (0.5 g) |
| Dispersion resin (II) | SP-006 (10 g) | Polyester (i) | Succinic anhydride (0.5 g) |
| Dispersion resin (III) | SP-006 (10 g) | Polyester (i) | Succinic anhydride (1.5 g) |
| Dispersion resin (IV) | SP-006 (10 g) | Polyester (i) | Succinic anhydride (2.2 g) |

As shown in Table 1, in the Examples, the dispersibility of pigment and the ability to form a colored pattern (photolithography capability) of the colored pattern can be both improved while containing the pigment at a high concentration.

All publications, patent applications, and technical standards mentioned in this specification are herein incorporated by reference to the same extent as if each individual publication, patent application, or technical standard was specifically and individually indicated to be incorporated by reference.

What is claimed is:

1. A colored curable composition for a color filter comprising:
   (A) a pigment in a amount of from 35 to 70 mass % with respect to the total solid content of the colored curable composition,
   (B) an amino resin,
   (C) an alkali-soluble resin,
   (D) a polymerizable monomer, and
   (E) a photopolymerization initiator,
   the ratio of (B) the amino resin to (C) the alkali-soluble resin ((B):(C); mass ratio) being in the range of from 1:1 to 10:1.

2. The colored curable composition for a color filter according to claim 1, wherein (B) the amino resin has (i) a main chain portion having a nitrogen atom, (ii) a group X having a functional group having a pKa of 14 or less and being bonded to the nitrogen atom present in the main chain portion, and (iii) an oligomer or polymer chain Y that is present at a side chain of the main chain portion and has a number average molecular weight of from 500 to 1,000,000.

3. The colored curable composition for a color filter according to claim 2, wherein (i) the main chain portion having a nitrogen atom comprises an oligomer or a polymer having an amino group.

4. The colored curable composition for a color filter according to claim 2, wherein (i) the main chain portion having a nitrogen atom comprises at least one of poly(lower-alkylene imine), polyallylamine, polydiallylamine, a metaxylenediamine-epichlorohydrin polycondensate, polyvinylamine, a 3-dialkyl aminopropyl(meth)acrylamide copolymer, or a 2-dialkylaminoethyl (meth)acrylate copolymer.

5. The colored curable composition for a color filter according to claim 2, wherein the functional group having a pKa of 14 or less comprises at least one of a carboxylic acid group, a sulfonic acid group, or —COCH$_2$CO—.

6. The colored curable composition for a color filter according to claim 2, wherein the group X having a functional group having a pKa of 14 or less comprises at least one group having a structure represented by Formula (V-1), Formula (V-2), or Formula (V-3),

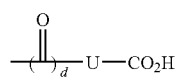

Formula (V-1)

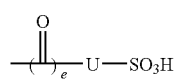

Formula (V-2)

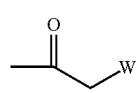

Formula (V-3)

wherein in Formula (V-1) and Formula (V-2), U represents a single bond or a divalent linking group and d and e each independently represent 0 or 1, and, in Formula (V-3), W represents an acyl group or an alkoxycarbonyl group.

7. The colored curable composition for a color filter according to claim 1, wherein (B) the amino resin comprises a repeating unit represented by Formula (I-1) and a repeating unit represented by Formula (I-2),

Formula (I-1)

Formula (I-2)

wherein, in Formulae (I-1) and (1-2), $R^1$ and $R^2$ each independently represent a hydrogen atom, a halogen atom, or an alkyl group; a represents an integer of 1 to 5; * represents a linking portion of each repeating unit; X represents a group having a functional group having a pKa of 14 or less, and Y represents an oligomer or polymer chain having a number average molecular weight of from 500 to 1,000,000.

8. The colored curable composition for a color filter according to claim 7, wherein (B) the amino resin further comprises a repeating unit represented by Formula (I-3),

Formula (I-3)

wherein, in Formula (I-3), $R^1$ and $R^2$ each independently represent a hydrogen atom, a halogen atom, or an alkyl group; a represents an integer of 1 to 5; * represents a linking portion of each repeating unit, and Y' represents an oligomer or polymer chain having an anionic group and having a number average molecular weight of from 500 to 1,000,000.

9. The colored curable composition for a color filter according to claim 1, wherein (B) the amino resin comprises a repeating unit represented by Formula (II-1) and a repeating unit represented by Formula (II-2),

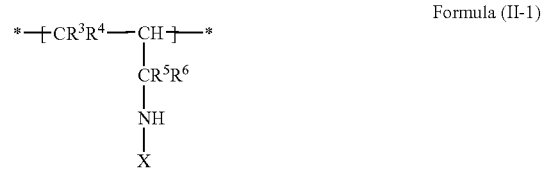

Formula (II-1)

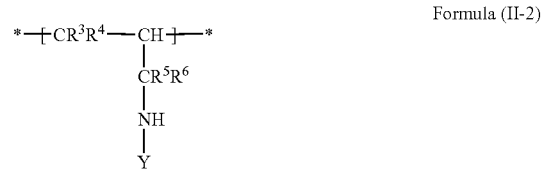

Formula (II-2)

wherein, in Formulae (II-1) and (II-2), $R^3$, $R^4$, $R^5$, and $R^6$ each independently represent a hydrogen atom, a halogen atom, or an alkyl group; * represents a linking portion of each repeating unit; X represents a group having a functional group having a pKa of 14 or less, and Y represents an oligomer or polymer chain having a number average molecular weight of from 500 to 1,000,000.

10. The colored curable composition for a color filter according to claim 9, wherein (B) the amino resin further contains a repeating unit represented by Formula (II-3),

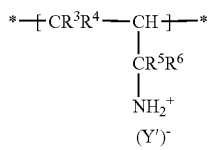

Formula (II-3)

wherein, in Formula (II-3), $R^3$, $R^4$, $R^5$, and $R^6$ each independently represent a hydrogen atom, a halogen atom, or an alkyl group; * represents a linking portion of each repeating unit; and Y' represents an oligomer or polymer chain having an anionic group and having a number average molecular weight of from 500 to 1,000,000.

11. The colored curable composition for a color filter according to claim 2, wherein the oligomer or polymer chain Y having a number average molecular weight of from 500 to 1,000,000 is at least one oligomer or polymer chain selected from polyester, polyamide, polyimide, and poly(meth)acrylic ester.

12. The colored curable composition for a color filter according to claim 1, wherein the ratio of the total amount of (B) the amino resin and (C) the alkali-soluble resin to (A) the pigment ((B+C):A; mass ratio) is in the range of from 3:10 to 5:10.

13. A color filter, comprising a colored pattern formed on a support using the colored curable composition for a color filter according to claim 1.

14. A method for producing a color filter, comprising:
applying the colored curable composition for a color filter according to claim 1 onto a support, and
pattern exposing and developing a coated layer formed by applying the colored curable composition to form a colored pattern.

15. A solid state imaging device, comprising the color filter according to claim 13.

* * * * *